US005509192A

United States Patent [19]

Ota et al.

[11] Patent Number: 5,509,192

[45] Date of Patent: Apr. 23, 1996

[54] APPARATUS FOR PRESS-FITTING CONNECTORS INTO PRINTED BOARDS

[75] Inventors: Yasunori Ota; Nobuhide Fujita; Keiji Yamamoto, all of Tokyo, Japan

[73] Assignee: Ando Electric Co., Ltd., Tokyo, Japan

[21] Appl. No.: 219,455

[22] Filed: Mar. 29, 1994

[30] Foreign Application Priority Data

| | | | |
|---|---|---|---|
| Mar. 30, 1993 | [JP] | Japan | 5-072506 |
| Mar. 30, 1993 | [JP] | Japan | 5-072508 |
| Mar. 30, 1993 | [JP] | Japan | 5-095290 |

[51] Int. Cl.⁶ ............ H05K 3/32; H01R 9/09; B23P 19/02; B23P 21/00

[52] U.S. Cl. ............ 29/741; 29/703; 29/710; 29/712; 29/743

[58] Field of Search ............ 29/33 M, 703, 29/710, 712, 721, 739, 740, 741, 743, 747, 759, 833, 845

[56] References Cited

U.S. PATENT DOCUMENTS

| | | | |
|---|---|---|---|
| 4,566,071 | 1/1986 | Takahashi | 29/740 X |
| 4,602,417 | 7/1986 | Mesch et al. | 29/712 X |
| 4,649,633 | 3/1987 | Bocchicchio et al. | 29/743 X |
| 5,400,502 | 3/1995 | Ota et al. | 29/741 X |

FOREIGN PATENT DOCUMENTS

| | | | |
|---|---|---|---|
| 4321300 | 11/1992 | Japan | 29/743 |
| 8603369 | 6/1986 | WIPO | 29/741 |

OTHER PUBLICATIONS

Camp et al "Power Lug Insertion Apparatus" Western Electric Technical Digest No. 58, Apr. 1980, S0456, pp. 7–8.

*Primary Examiner*—Peter Vo
*Attorney, Agent, or Firm*—Finnegan, Henderson, Farabow, Garrett & Dunner

[57] ABSTRACT

The present connector press-fitting apparatus comprises a press-fitting head, a press-fitting block, a cylinder, a positional detector, a pin detector, and a controller. The press-fitting head comes into contact with the connector, and attaches to and detaches from this connector. The press-fitting block supports the press-fitting head elastically. The cylinder is capable of moving the press-fitting block freely in a vertical direction, lowers the press-fitting block, and press-fits pins of the connector into a printed board which is arranged at a press-fitting position. The positional detector detects the displacement of the press-fitting head. The pin detector detects at least one pin lead end part projecting below the printed board in accordance with the press-fitting operation of the connector by means of the cylinder. The controller detects when the press-fitting block is in a standard insertion position by means of the positional detector, and at the point in time at which the pin detector has detected at least one pin lead end part, the controller lowers the press-fitting block by means of the cylinder and press-fits the pin base end parts of the connector into the printed board.

6 Claims, 13 Drawing Sheets

APPARATUS FOR PRESS-FITTING CONNECTORS INTO PRINTED BOARDS

BACKGROUND OF THE INVENTION

1. Field of the Invention

The present invention relates to an apparatus for press-fitting connectors into a printed board, wherein, by means of press-fitting pins into through-holes formed in a connector, for example, a printed board, a press-fit connector, in which these pins are electrically connected with a pattern formed in the printed board, without the use of solder, is press-fitted into the printed board.

2. Related Art

As is commonly known, in production lines in which parts are automatically mounted on printed boards, there are numerous cases in which apparatuses are provided which press-fit connectors, termed "press-fit connectors", into printed boards. The structural outlines of this type of connector press-fitting apparatus will be explained with reference to FIG. 11. In FIG. 11, stocker 1 stores and maintains a plurality of press-fit connectors 2 (hereinbelow shortened to "connectors") of a single type in a magazine case. Conveyor unit 3 comprises a gripping mechanism 3*a*, which grips connectors 2 and which is freely movable in a vertical direction, and conveyor mechanism 3*b*, which conveys this gripping mechanism 3*a* to the side of insertion unit 4; this conveyor unit 3 conveys connectors 2 which have been removed from stocker 1 to the side of insertion unit 4, and inserts these connectors 2 into insertion unit 4.

Here, the relationship between insertion unit 4 and connector 2 will be explained with reference to FIG. 12. First, connector 2 is provided with a housing 2*b* having a cross sectional U-shape, and a plurality of pins 2*a* is vertically provided therein at pre-specified intervals. Pin insertion holes 4*a*, which correspond to the intervals at which pins 2*a* are disposed, are provided in insertion unit 4. Pin insertion holes 4*a* have a tapered opening part, the diameter of the opening part thereof is greater than the diameter of the lead end parts 2*a*1 of the pins 2*a*, and is smaller than that of the base end part 2*a*2. For this reason, the lead end parts 2*a*1 of pins 2*a* are inserted into the pin insertion holes 4*a*, and are thereby aligned. Insertion unit 4 is elastically supported by a shaft 4*c* which is affixed to an attachment plate 5*a*, through the medium of a compression coil spring 4*d*; by means of this, the shock during the installation of a connector 2 is absorbed.

Pin insertion holes 4*a* communicate with a hollow part 4*b* which is formed within insertion unit 4, and the pressure within this hollow part 4*b* is reduced by means of a vacuum pump through the medium of a joint 6. That is to say, when the connector 2 is inserted into this insertion unit 4, the pressure within the hollow part 4*b* is reduced, and the lead end parts 2*a*1 of pins 2*a* are attached by suction within pin insertion holes 4*a*. The insertion unit 4 which is provided with this type of structure is transported to the press-fitting position by means of the transport mechanism 5 which is shown in FIG. 11. That is to say, as shown in FIG. 11, this transport mechanism 5 moves the insertion unit 4 to a position in opposition to press-fitting head 7 by means of slide rails 5*b*, which couple the attachment plate 5*a* described above and the base plate 5*c*.

Press-fitting head 7 is coupled with a press-fitting unit 8, which is structured so as to be freely vertically movable, and is raised or lowered in accordance with the upwards or downwards motion of this press-fitting unit 8. When the insertion unit 4 is placed at the position in opposition to the press-fitting head 7 by the transport mechanism 5, this press-fitting head 7 comes into contact with the connector 2 within the insertion unit 4, and is attached thereto by suction. The interior of press-fitting head 7 has a reduced pressure by means of a vacuum pump which is not depicted in the Figure, and is attached by suction to connector 2, while on the other hand, when connector 2 is detached, compressed air is introduced into the interior thereof. NC (numerically controlled) movement table 9 is provided above bed 10, and this conducts positioning so that the connector 2, which is in a state of suction attachment, and the connector press-fitting apparatus, which is above the printed board 11, are in agreement, and disposes printed board 11 at a pre-specified position.

In accordance with the above construction, conveyor unit 3 removes a connector 2 from stocker 1, and inserts this into insertion unit 4, and the insertion unit 4 having connector 2 inserted thereinto is placed at a position in opposition to press-fitting head 7 by means of transport mechanism 5. When insertion unit 4 is disposed at a stipulated position in this manner, press-fitting unit 8 descends, and in accordance with this, the press-fitting head 7 comes into contact with connector 2 within insertion unit 4, and is attached thereto by suction. When press-fitting head 7 attaches to connector 2 by means of suction, the press-fitting unit 8 is lifted. Next, transport mechanism 5 returns to its original position, from the position in which insertion unit 4 is in opposition to press-fitting head 7, and in accordance with this, the NC movement table 9 disposes the printed board 11 at the press-fitting position. Here, the press-fitting head 7 again descends in accordance with the movement of press-fitting unit 8, and press-fits the pins of the connector 2, which is in a state of suction attachment, at the press-fitting position on printed board 11. After this, compressed air is introduced into the interior of press-fitting head 7, and connector 2 is detached.

In the conventional connector press-fitting apparatus described above, pin insertion holes 4*a* which are formed with a tapered shape are provided in insertion unit 4, and by inserting pins 2*a* in these pin insertion holes 4*a*, even in cases in which there is positional deviation during the conveyance of connector 2, or in which inclination or bending or the like of the pins 2*a* occurs, insofar as this is within the largest diameter of the taper, the pins 2*a* are guided to the opening of the tapered shape, and are inserted into the insertion unit 4.

In the case in which the pins 2*a* themselves have low rigidity, the inclination or bending or the like is corrected by the insertion thereof into pin insertion holes 4*a*; however, when the rigidity of the pins 2*a* is high, when they are removed from the insertion unit 4 by means of the press-fitting head 7 described above, the pins return to the original state thereof. When press-fitting operations are conducted in such a state, even if the printed board 11 is accurately placed at the press-fitting position, the pins 2*a* will not enter the through-holes formed in printed board 11, and if downward pressing is conducted, there is some danger of causing damage to the printed board 11 or the like. Furthermore, even in the case in which there is no inclination or bending or the like in the pins 2*a* themselves, if there is a mistake in the position of the printed board 11, the pins 2*a* will not enter the through-holes of printed board 11 in a like manner, and damage may be caused to the printed board 11 in the same manner.

Furthermore, in the conventional connector press-fitting apparatus described above, connectors 2 which were inserted in an abnormal manner into printed boards 11 are determined to have press-fitting deficiencies and are removed; however, if such connectors 2 are present in large numbers, this presents a problem in that the yield of connectors 2 press-fitted into printed boards 11 worsens.

The cause of the press-fitting deficiencies in the majority of cases is positioning error at the lead end part of the pins 2*a* as a result of the inclination of the pins 2*a* of the connector 2. This inclined state of the pins 2*a* of the connector 2 will be explained with reference to FIGS. 13A–C. FIG. 13A shows the state in which the pins 2*a* are inserted normally into connector 2, while FIG. 13B shows a state in which the pins are inserted in an inclined manner with respect to the housing 2*b*. FIG. 13C shows a state in which the pins 2*a* are inserted perpendicularly with respect to the housing 2*b*; however, the extent to which the pins 2*a* enter the housing 2*b* differs. In FIG. 13A, the upper end part 2*a*3 of the pins 2*a* enters the holes 7*a* of the press-fitting head 7, and these upper end parts 2*a*3 are held by suction therewithin, so that if in this state the connector 2 is press-fitted into the printed board 11, the base end parts 2*a*2 of the pins 2*a* enter the through-holes of the printed board 11, and the press-fitting is complete. In FIG. 13A, the attachment parts 2*a*4 of the pins 2*a* of the connector 2 come into contact with the press-fitting surface 7*b* of the press-fitting head 7 in a perpendicular manner. The states shown in FIGS. 13B and 13C can be considered to be generated during the assembly of the housing 2*b* and pins 2*a* of the connector 2; the pins 2*a* are all inclined in the same direction and to approximately the same extent. In FIGS. 13B and 13C, the inclination of the pins 2*a* is expressed in an exaggerated manner; however, in the measured values, even when the lead end part 2*a*1 of the pins 2*a* is long, having a length of approximately 20 mm, the positional deviation at the lead end is on the level of 0.2–0.5 mm.

Furthermore, in the conventional connector press-fitting apparatus described above, the object of mounting was a single type of connector. However, recently, there are a very large number of cases in which a plurality of types of connectors is installed in one printed board. For this reason, in the case in which a plurality of differing connectors are to be installed in a printed board 11, when the type of connector is altered, the automatic installation operation described above is halted, and each time, it is necessary to replace the press-fitting head 7 and the insertion unit 4 with ones corresponding to the type of connector.

As a result, the portion of the installation operation period with is occupied by the part interchange operation is large, and this tends to lead to a decline in operational efficiency. Moreover, this type of part interchange operation is conducted by human labor, so that this represents a great obstacle to the reduction of power consumption. That is to say, in other words, in conventional connector press-fitting apparatuses, there was a problem in that a plurality of differing types of connectors could not be installed automatically and with a high efficiency.

SUMMARY OF THE INVENTION

Accordingly, it is a first object of the present invention to provide a connector press-fitting apparatus which will not cause damage to the printed board even in cases in which positional deviation is generated in the connector or the printed board, or in which inclination or bending or the like occurs in the pins of the connector. Furthermore, it is a second object of the present invention to provide a connector press-fitting apparatus which is capable of using the tendency of the pins of the connector to be inclined in order to increase the yield of the insertion of the connectors into the printed board. Furthermore, it is a third object of the present invention present invention to provide a connector press-fitting apparatus which is capable of installing a plurality of types of connectors automatically and high efficiency.

Accordingly, the present invention is characterized in being provided with: a press-fitting head, which makes contact with a connector, and which attaches to and detaches from this connector; a support mechanism, which elastically supports the press-fitting head; a press-fitting mechanism, which is capable of freely moving the support mechanism in the vertical direction, and which moves the support mechanism downward and press-fits pins of the connector into a printed board disposed at a press-fitting position; a first detecting mechanism, which is a means for detecting displacement of the press-fitting head, and which detects an amount of distance in an insertion operation in which the press-fitting mechanism descends and pin lead end parts of the connector are inserted into the printed board; a second detecting mechanism, for detecting at least one pin lead end part projecting below the printed board in accordance with the insertion operation; and a control mechanism, which, at a point in time at which the first detecting mechanism detects an appropriate amount of distance, and the second detecting mechanism detects at least one pin lead end part, moves the press-fitting mechanism further downward and press-fits pin base end parts of the connector into the printed board.

In accordance with the present invention, at the point in time at which the first detecting mechanism detects an appropriate amount of distance, and the second detecting mechanism detects at least one pin lead end part, the control mechanism moves the press-fitting mechanism downward and press-fits the pin base ends of the connector into the printed board. Accordingly, in cases other than this, it is presumed that the connector or printed board were not accurately disposed at the press-fitting positions or that an inclination, bending, or the like was present in the pins of the connector, and the press-fitting is halted. At this time, the press-fitting head comes into contact with the printed board as a result of the insertion operation; however, because the support mechanism elastically supports the press-fitting head, the downward force is absorbed at this time, and even in cases in which there was positional deviation of the connector or the printed board, or in cases in which inclination, bending, or the like was present in the pins of the connector, no damage will be caused to the printed board.

Furthermore, the present invention is characterized in being provided with: a moving table, on which a printed board into which a connector is to be press-fitted is placed, and which is capable of independent movement in a vertical direction and a horizontal direction in a plane; a press-fitting head, which makes contact with the connector and which attaches to and detaches from the connector; a press-fitting mechanism, which is capable of moving the press-fitting head in a vertical direction, and which moves the press-fitting head downward and press-fits the pins of the connector into the printed board; a detecting mechanism, which, when the connector is press-fitted into the printed board, detects at least one pin lead end part of the connector projecting below the printed board; a first memory mechanism, which stores press-fitting coordinates comprising coordinates at which the connector is to be press-fitted into the printed board; a second memory mechanism, which stores correction coordinates comprising coordinates separated by a pre-specified distance from the press-fitting coordinates; and a control mechanism, which reads the press-fitting coordinates and said correction coordinates from the first and second memory mechanism, moves the moving table based on the press-fitting coordinates and the correction coordinates, and moves the press-fitting mechanism upwards and downwards;

and after the control mechanism reads out the press-fitting coordinates from the first memory mechanism and moves the moving table based on the press-fitting coordinates, when the press-fitting head is moved downwards by the press-fitting mechanism and the connector is press-fitted into the printed board, in the case in which the detecting mechanism does not detect at least one the pin lead end part, then after the press-fitting head is moved upwards by means of the press-fitting mechanism, the control mechanism reads out correction coordinates stored in the second memory mechanism and moves the moving table based on the correction coordinates, moves the press-fitting head downwards by means of the press-fitting mechanism and press-fits the connector into the printed board, and at this time, the control mechanism repeats, for a pre-specified number of times, processing wherein a determination is made as to whether or not the detecting mechanism has detected at least one the pin lead end part, and in the case in which the detecting mechanism does not detect at least one the pin lead end part even after repeating the processing for the pre-specified number of times, the control mechanism detaches the connector from the press-fitting head as a connector having a press-fitting deficiency, and in the case in which at least one pin lead end part was detected by the detecting mechanism in the processing, the control mechanism first moves the moving table based on the press-fitting coordinates, moves the press-fitting mechanism further downward and press-fits pin base end parts of the connector into the printed board, and writes correction coordinates at this time into the second memory mechanism.

In accordance with the present invention, in the case in which the connector is not inserted at the press-fitting coordinates of the printed board, the connector is inserted at the correction coordinates, so that connector press-fitting deficiencies can be reduced. Accordingly, the yield of the insertions of the connector into the printed board is increased. Furthermore, if the correction coordinates are set in a direction in which the pins of the connector tend to incline, and the connector is inserted at the connection coordinates which are continuously inserted, the probability of insertion is increased, and the operational efficiency increases.

Furthermore, the present invention is characterized in comprising: a storage mechanism, which stores a plurality of connectors, having a plurality of types, which are to be press-fitted into a printed board; a control mechanism, which generates at least a first directive which designates at least the type of the connector, and a second directive, which indicates an mounting position on a printed board at which a connector designated by this first directive is to be press-fitted; an insertion block arrangement mechanism, which is provided with a plurality of insertion blocks comprising members into which lead end parts of pins of the connectors are to be inserted and in which pin insertion holes corresponding to the plurality of type of connectors are formed, and which selects insertion blocks corresponding to the first directive from among the insertion blocks, and arranges these at insertion positions; a conveying mechanism, which removes connectors corresponding to the first directive from the storage mechanism, conveys the connectors to the insertion positions, and inserts these into the insertion blocks; a transport mechanism, which transports the insertion blocks into which the connectors have been inserted by the conveying mechanism, to press-fitting positions; a suction attachment mechanism, which is provided with a plurality of press-fitting heads in which pin insertion holes corresponding to the plurality of types of connectors are respectively formed, and into which upper end parts of pins of corresponding connectors are inserted, which selects a press-fitting head corresponding to the first directive from among these press-fitting heads, arranges this at the press-fitting position, brings this press-fitting head into contact with a connector which is inserted into the insertion block, and attaches the connector to the press-fitting head by means of suction; a positioning mechanism, which is established below the suction attachment mechanism, maintains the printed board so as to be in opposition to the press-fitting heads, and positions the installation position on this printed board to the press-fitting position in accordance with the second directive; and a pressure-receiving mechanism, which is established below the positioning mechanism, which is provided with a plurality of pressure-receiving heads in which pin insertion holes corresponding to the plurality of types of connectors are respectively formed, and into which lower end parts of pins of corresponding connectors are inserted, and which selects a pressure-receiving head corresponding to the first directive from among these pressure-receiving heads, and arranges this at the press-fitting position; and in that the suction attachment mechanism lowers the press-fitting head in a state in which it maintains suction attachment of the connector, while the pressure receiving mechanism raises the pressure-receiving head, and in a state in which the printed board is interposed between the press-fitting head and the pressure-receiving head, the connector is maintained in a sandwiched manner, while the connector is press-fitted at an installation position on the printed board.

In accordance with the present invention, the insertion block arrangement mechanism, suction attachment mechanism, and pressure-receiving mechanism are provided in advance with a plurality of insertion blocks, press-fitting heads, and pressure-receiving heads corresponding to the various types of connectors, respectively, and a press-fitting operation is conducted in which items corresponding to the type of connector which is to be press-fitted to the printed board are selected from among these in accordance with the first directive which is generated by the control mechanism, so that it is possible to install a plurality of types of connectors on printed boards automatically and with high efficiency.

DETAILED DESCRIPTION OF THE INVENTION

Hereinbelow, embodiments of the present invention will be explained with reference to the Figures.

1. FIRST EMBODIMENT

Figure 1:
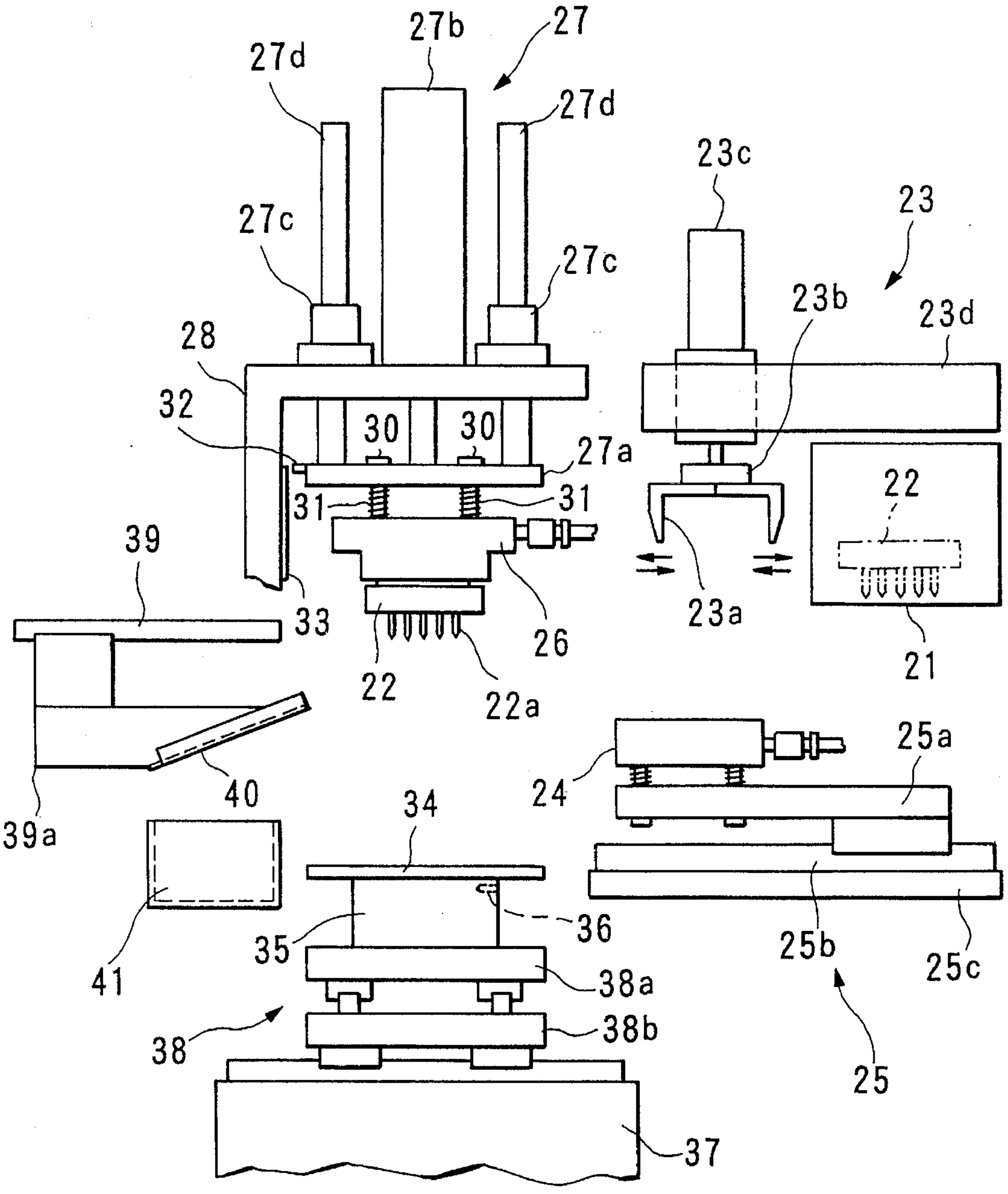
FIG. 1 is a front view showing the composition of a connector-press-fitting apparatus in accordance with a first embodiment of the present invention.

FIG. 1 is a front view showing the construction of a connector press-fitting apparatus in accordance with a first embodiment of the present invention. In FIG. 1, a plurality of connectors 22 are stored in a stocker 21. Conveyor unit 23 comprises a chuck 23*a*, a floating mechanism 23*b*, a cylinder 23*c*, and a conveying mechanism 23*d*. Chuck 23*a* is supported by floating mechanism 23*b*, and is connected to cylinder 23*c*. Cylinder 23*c* moves chuck 23*a* upwards and downwards. Conveying mechanism 23*d* moves chuck 23*a* horizontally between stocker 21 and insertion unit 24. After removing a connector 22 from the stocker 21, chuck 23*a* is conveyed above insertion unit 24 by means of conveying mechanism 23*d*. Next, chuck 23*a* is lowered by means of cylinder 23*c*, and thereby, connector 22 is inserted into insertion unit 24. Insertion unit 24 is elastically supported on attachment plate 25*a* of transport mechanism 25. Transport mechanism 25 moves insertion unit 24 below press-fitting head 26 by means of the slide rail 25*b* connecting attachment plate 25*a* and base plate 25*c*.

Press-fitting head 26 is elastically coupled with a press-fitting unit 27 which is formed so as to be freely movable in a vertical direction, and press-fitting head 26 is lifted and lowered in accordance with the upward and downward motion of this press-fitting unit 27. When transport mechanism 25 moves insertion unit 24 to a position in opposition to press-fitting head 26, press-fitting head 26 first comes into contact with the connector 22 within insertion unit 24, and then the pressure in the interior of the press-fitting head 26 is reduced by means of a vacuum pump which is not depicted in the Figure, and press-fitting head 26 is attached by suction to connector 22. When connector 22 is to be detached, compressed air is introduced into the interior of press-fitting head 26.

Press-fitting unit 27 is attached to a L-shaped base member 28, and comprises a press-fitting block 27*a*, a cylinder 27*b*, guides 27*c*, and guide shafts 27*d*. Cylinder 27*b* has one end thereof affixed to the press-fitting block 27*a*, and is capable of moving press-fitting block 27*a* freely in a vertical direction. Guide shafts 27*d* have one end thereof affixed to press-fitting block 27*a*, and slide upward and downward along with press-fitting block 27*a*, guided by guides 27*c* which are attached to base member 28. These guide shafts 27*d* restrict the lateral oscillation during the ascent and decent of press-fitting block 27*a*.

Figure 2:
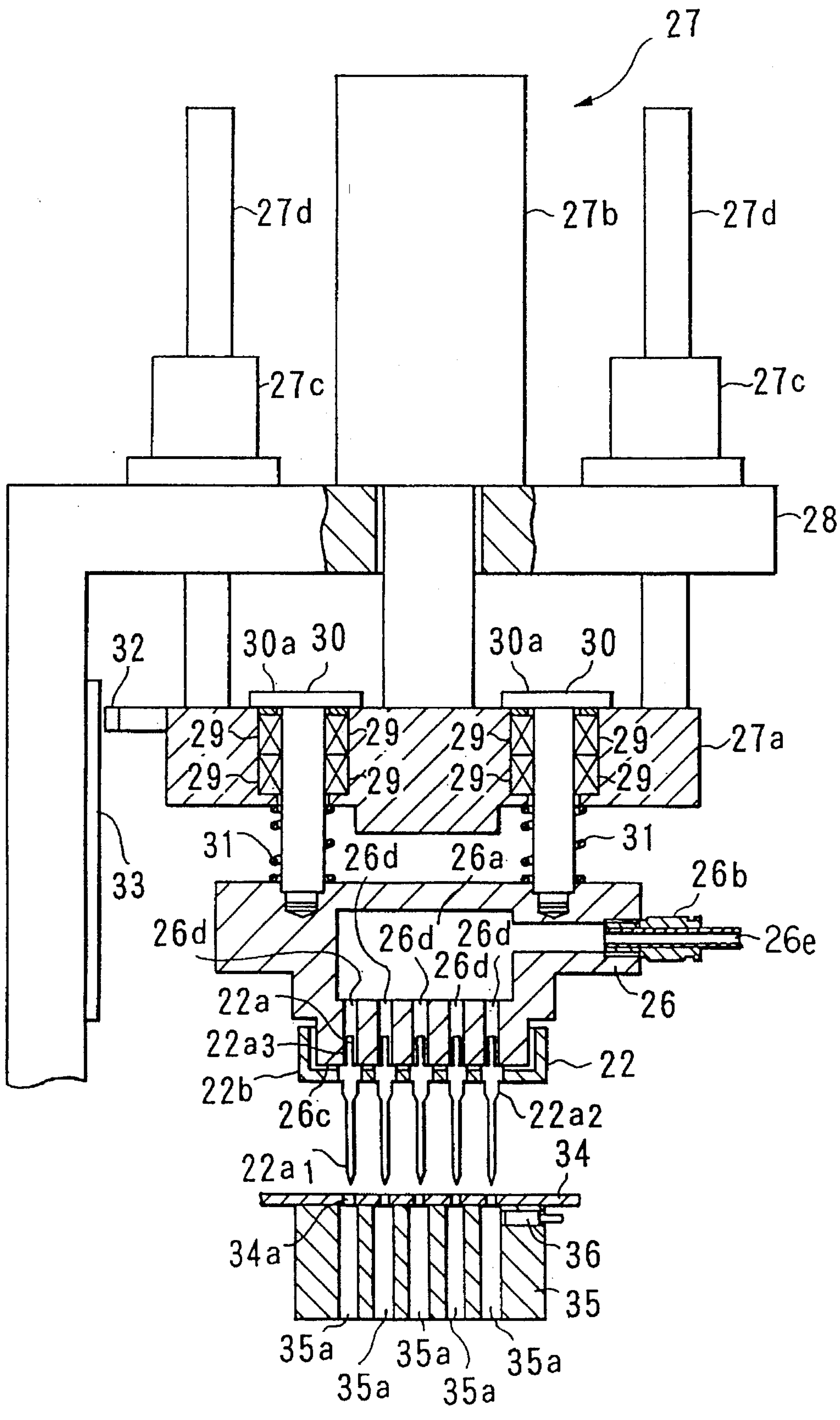
FIG. 2 is a partial cross sectional view showing the more detailed construction of the press-fitting head 26 and the press-fitting unit 27 shown in FIG. 1.

Here, a partially cross sectional view showing the more detailed construction of the press-fitting head 26 and the press-fitting unit 27 is shown in FIG. 2. In FIG. 2, guides 29 are fitted into holes formed in press-fitting block 27*a*. Shafts 30 pass through press-fitting block 27*a*, and slide freely along guides 29. Suspending parts 30*a*, which are suspended at the upper surface of the press-fitting block 27*a*, are formed at the upper end side of shafts 30, and the lower end sides of shafts 30 are affixed to the upper surface part of press-fitting head 26. Furthermore, compression coil springs 31 are installed encircling these shafts 30, and one end of these compression coil springs 31 comes into contact with the upper surface of the press-fitting head 26, while the other end thereof is in contact with the lower surface of the press-fitting block 27*a*. Accordingly, these compression coil springs 31 urge press-fitting block 27*a* into contact with the suspending part 30*a* of shafts 30, and thus support press-fitting head 26 elastically with respect to press-fitting block 27*a*.

A position detector 32 is installed at the side surface of press-fitting block 27*a*, and a scale 33 is installed along the side surface of base member 28 so as to oppose this position detector 32. Here, for example, in the case in which the position detector 32 comprises a commonly-known magnetic resistance element, then the scale 33 comprises a magnetic scale which is magnetized with N and S poles at predetermined intervals. That is to say, position detector 32 measures the amount of displacement of press-fitting block 27*a* in a noncontacting manner, and outputs a positional signal to a control unit (not depicted in the Figure). The position detector 32 is not limited to the magnetic-resistance element described above; it is also possible to employ an optical sensor. Furthermore, it is also possible to provide a position detector such as an ultrasonic sensor or the like on press-fitting head 26, and to directly detect the distance from the printed board 34 facing this press-fitting head 26; in such a structure, the scale 33 may be omitted.

A hollow portion 26*a* is formed in the interior of the press-fitting head 26, which is affixed to press-fitting block 27*a* through the medium of shafts 30, as shown in FIG. 2, and a tube 26*e* is connected to the side surface of this hollow portion 26*a* through the medium of a joint 26*b*. This tube 26*e* is connected to a vacuum pump or a compressor pump which is not depicted in the Figure. Furthermore, penetrating grooves 26*d*, which correspond to the pin arrangement of the connector 22, are formed between the lower surface of the hollow portion 26*a*, and the press-fitting surface 26*c* of the press-fitting head 26. The upper end parts 22*a*3 of the pins 22*a* are inserted into these penetrating grooves 26*d*, and in the case in which the pressure within the hollow portion 26*a* is reduced, connector 22 is attached by suction to press-fitting surface 26*c*. In the case in which compressed air is introduced into the hollow portion 26*a*, press-fitting head 26 detaches from connector 22.

A support platform 35, which is affixed to and supports the printed board 34, is provided below press-fitting head 26 so as to be in opposition to the connector 22, which is attached by suction to this press-fitting head 26; printed board 34 is arranged at the press-fitting position. Recess holes 35*a*, which correspond to through holes 34*a* which are formed in printed board 34, are provided in support platform 35, and the lead end parts 22*a*1 of the pins 22*a* of the connector 22 which is press-fitted are inserted into these recess holes 35*a*. Furthermore, a pin detector 36 is provided at the side surface of the opening of at least one recess hole 35*a* in support platform 35. Pin detector 36 comprises a commonly-known proximity switch or photo-interrupter or the like, and detects the lead end part 22*a*1 of a pin 22*a* which is inserted into this recess hole 35*a*.

In FIG. 1, support platform 35 is affixed to and supported by a NC-movement table 38 which is provided above a bed 37. NC-movement table 38 comprises an X-stage 38*a* and Y-stage 38*b*, and moves the connector mounting position on printed board 34 to the press-fitting position described above. This NC-movement table 38 drives the X-stage 38*a* and the Y-Stage 38*b* in accordance with a directive signal supplied from a control unit which is not depicted in the Figure, and thus conducts positioning. Based on a directive from a control unit which is not depicted in the Figure, conveyor mechanism 39 conveys a chute 40 which inclines the bottom surface of a vessel-shaped member and is attached to a conveyor arm 39*a*, to the press-fitting position, receives the connector 22 which is detached from the press-fitting head 26, and ejects this into recovery case 41. Defective connectors, which have inclination or bending in the pins 22*a*, or which are determined to cause damage to the printed board 34 during press-fitting, are ejected into recovery case 41 by means of an operation which will be described hereinbelow.

Next, the press-fitting operation of the connector press-fitting apparatus having the structure described above will be explained with reference to FIGS. 1 and 2. The position of press-fitting block 27*a* when lead end parts 22*a*1 of pins 22*a* of the connector 22 are inserted in through holes 34*a* formed in printed board 34 is stored in advance in a control unit (not depicted in the Figure) which oversees and controls this connector press-fitting apparatus, as a standard insertion position. That is to say, when connector 22 is press-fitted into printed board 34, the position of press-fitting block 27*a* which is detected by the positional detector 32 described above is employed as the standard insertion position, and these values are entered into the control unit in advance.

When a connector 22 is placed at the press-fitting position in opposition to the press-fitting head 26 as a result of the operations of the conveyor unit 23, insertion unit 24, and transport mechanism 25 described above, the press-fitting unit 27 is lowered, and in accordance with this, the press-fitting head 26 comes into contact with the connector 22 within the insertion unit 24, the upper end parts 22*a*3 of pins 22*a* of this connector 22 are attached by suction to the press-fitting head 26, and press-fitting unit 27 is thereupon lifted temporarily. Next, transport mechanism 25 returns the insertion unit 24 to the original position thereof, from the position in opposition to the press-fitting head 26, and in accordance with this, NC-movement table 38 arranges printed board 34 at the press-fitting position.

When printed board 34 is placed at the press-fitting position, press-fitting unit 27 presses the press-fitting block 27*a* downward. At this time, the position detector 32 which is disposed in opposition to scale 33 detects the position of the descending press-fitting block 27*a* in regular succession and outputs the positional data to the control unit. When press-fitting block 27*a* reaches the standard insertion position described above, the control unit directs a stoppage of the descent of the press-fitting unit 27, and a determination is made as to whether or not the pin detector 36 which is installed in support platform 35 has detected a lead end part 22*a*1 of a pin 22*a* of the connector 22.

Hereinbelow, the press-fitting operation under normal conditions which is conducted in the case in which this lead end part 22*a*1 is detected, and the operation during abnormal conditions which is conducted in the case in which this lead end part 22*a*1 is not detected, will be explained.

A: Press-fitting operations during normal operation

Here, when the pin detector 36 detects a lead end part 22*a*1 which is inserted into recess hole 35*a*, the control unit determines that positional displacement of the connector 22 or the printed board 34, or inclination or bending or the like in the pins 22*a* of the connector 22, are not present, and an appropriate press-fitting operation has been conducted, and again lowers the press-fitting block 27*a*. By means of this, the lead end parts 22*a*1 of the pins 22*a* of the connector 22 are inserted through the through holes 34*a* of the printed board 34. Next, furthermore, when the press-fitting block 27*a* is lowered, the base end parts 22*a*2 of pins 22*a* (see FIG. 2) come into contact with the opening surface of the through holes 34*a* of the printed board 34.

Next, press-fitting unit 27 lowers cylinder 27*b*, and when press-fitting block 27*a* is pressed downward, the resistance when the base end parts 22*a*2 of the pins 22*a* are press-fitted into the through holes 34*a* exceeds the resiliency of the compression coil spring 31, and the descent of the press-fitting head 26 is temporarily halted. Next, the press-fitting block 27*a* which presses downward with a force exceeding the resiliency of the compression coil spring 31, presses downward directly against the press-fitting head 26, and as a result, the base end parts 22*a*2 of the pins 22*a* of the connector 22 are press-fitted into the through holes 34*a* of the printed board 34.

B: Operation under abnormal conditions

In the case in which pin detector 36 does not detect the lead end part 22*a*1 of the pin 22*a* of the connector 22 even when the press-fitting block 27*a* reaches the standard insertion position described above, the control unit recognizes this as an "abnormality", and temporarily lifts the press-fitting head 26 to its original position. That is to say, in this case, the state is such that positional displacement of the connector 22 or the printed board 34 has occurred, or inclination or bending or the like has occurred in pins 22*a*, so that pins 22*a* are not inserted through through holes 34*a* of the printed board 34, and the lead ends of the pins 22*a* are in contact with the surface of the printed board 34.

It is not the case that the downward force of the press-fitting unit 27 is applied directly to the pins 22*a* which are in contact with the surface of the printed board 34; rather, when the pins 22*a* come into contact with a surface of the printed board 34, the downward force applied by the press-fitting block 27*a* is absorbed by the resiliency of the compression coil spring 31. Accordingly, during such abnormal periods, the pins 22*a* come into contact with the surface of the printed board 34 at a pressure corresponding merely to the resiliency of the compression coil spring 31, so that it is possible to prevent damage to the printed board 34.

As described above, when press-fitting head 26 is lifted to its original position, the control unit operates conveyor mechanism 39 and conveys chute 40 to the press-fitting position, and detaches connector 22 from press-fitting head 26. By means of this, connector 22 is ejected into recovery case 41 through the medium of chute 40 as a defective product.

In this manner, in accordance with the first embodiment described above, in the case in which the press-fitting block 27*a* reaches the standard insertion position, and a lead end part 22*a*1 of a pin 22*a* is not detected by the pin detector 36, it is determined that there is a positional deviation in the connector 22 or the printed board 34, or that inclination, bending, or the like has occurred in pins 22*a*, and the press-fitting operation is interrupted. Moreover, when the press-fitting block 27*a* reaches the standard insertion position, the lead ends of the pins 22*a* are in contact with the printed board 34; however, the pressure at this time corresponds to the resiliency of the compression coil spring 31, which is weaker than the downward force of the press-fitting unit 27, so that the printed board 34 is not damaged.

2. SECOND EMBODIMENT

Next, a second embodiment of the present invention will be explained.

Figure 3:
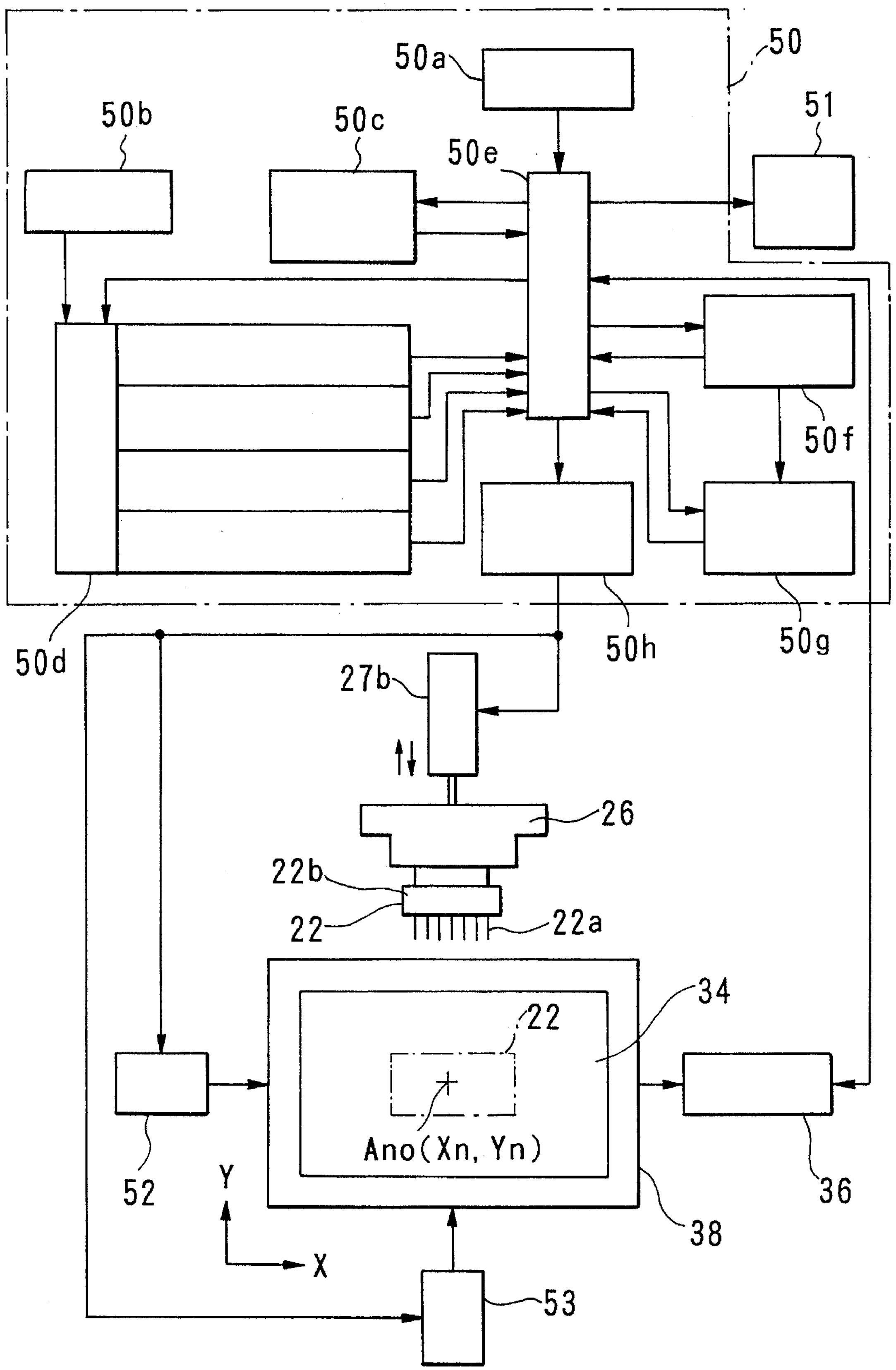
FIG. 3 is an outline diagram showing the construction of a connector press-fitting apparatus in accordance with a second embodiment of the present invention.

FIG. 3 is an outline diagram showing the construction of a connector press-fitting apparatus in accordance with the second embodiment of the present invention. In the construction of the connector press-fitting apparatus in accordance with the second embodiment, with the exception of control unit 50 and warning unit 51, the structure is identical to that of the connector press-fitting apparatus shown in FIG. 1, and parts corresponding thereto have identical reference numbers. Control unit 50 comprises input parts 50*a* and 50*b*, press-fitting coordinate memory 50*c*, setting memory 50*d*, main control unit 50*e*, correction coordinate memory 50*f*, counter memory 50*g*, and mechanism operation control unit 50*h*. Detector 36 and warning unit 51 are connected to control unit 50. Motors 52 and 53 move the X-stage 38*a* and the Y-stage 38*b* of the NC-movement table 38 in the X direction and the Y direction, respectively, and are provided in an identical manner in the connector press-fitting apparatus shown in FIG. 1, although not depicted in that Figure.

In FIG. 3, input part 50*a* sends the press-fitting coordinates An0 in the X-Y plane of the NC-movement table 38 to the main control unit 50*e*. Press-fitting coordinates An0 indicate the central position of the through holes 34*a* of the printed board 34 into which a connector 22 is to be press-fitted. Main control unit 50*e* directs the writing and reading of data to or from press-fitting coordinate memory 50*c*, setting memory 50*d*, and correction coordinate memory 50*f*, and the input and output of data among each structural element 50*a*–50*h*, by means of a program which is stored in a program memory within control unit 50 which is not depicted in the Figure. Main control unit 50*e* writes press-fitting coordinates An0 to press-fitting coordinate memory 50*f*, reads the press-fitting coordinates An0 which are stored in press-fitting coordinate memory 50*f*, and directs the mechanism operation control unit 50*h* so that NC-movement table 38 moves to these press-fitting coordinates An0. Mechanism operation control unit 50*h* is connected to the cylinder 27*b*, which moves the press-fitting head 26 upward and downward, a selector valve (not depicted in the Figure) which attaches and detaches connector 22 to and from press-fitting head 26, and motors 52 and 53; it controls the actuators thereof based on directives supplied from main control unit 50*e*.

Input part 50*b*, for example, a keyboard, inputs the initial setting conditions into setting memory 50*d*. Main control unit 50*e* writes correction coordinates Ani into correction coordinate memory 50*f* in the order of the flowcharts shown in FIGS. 6A and 6B below. Correction coordinates Ani express the coordinates of positions which are separated from press-fitting coordinates An0 by ±Δ1 in the X direction and the Y direction. Furthermore, main control unit 50*e* reads out correction coordinates Ani from correction coordinate memory 50*f*, and sends a directive to mechanism operation control unit 50*h* so that NC-movement table 38 is moved to correction coordinates Ani. Counter memory 50*g* stores the insertion frequency of connector 22 at correction coordinates Ani, and main control unit 50*e* reads out the insertion frequency from count memory 50*g* where necessary.

Next, the relationship between press-fitting coordinates An0 and correction coordinates Ani will be explained with reference to FIGS. 4 and 5. The press-fitting coordinates An0 (Xn, Yn) shown in FIGS. 4 and 5 indicate the central position of the through holes 34*a* of the printed board 34 into which connector 22 is to be press-fitted. Furthermore, the variable n of the press-fitting coordinates An0 (Xn, Yn) indicates the coordinates of the nth through hole 34*a* into which the connector 22 is to be press-fitted, and hereinbelow, this variable n will be termed the connector press-fitting position number. Through holes 34*a* are set to a size having a radius r, employing the press-fitting coordinates An0 (Xn, Yn) as the center thereof.

Figure 4:
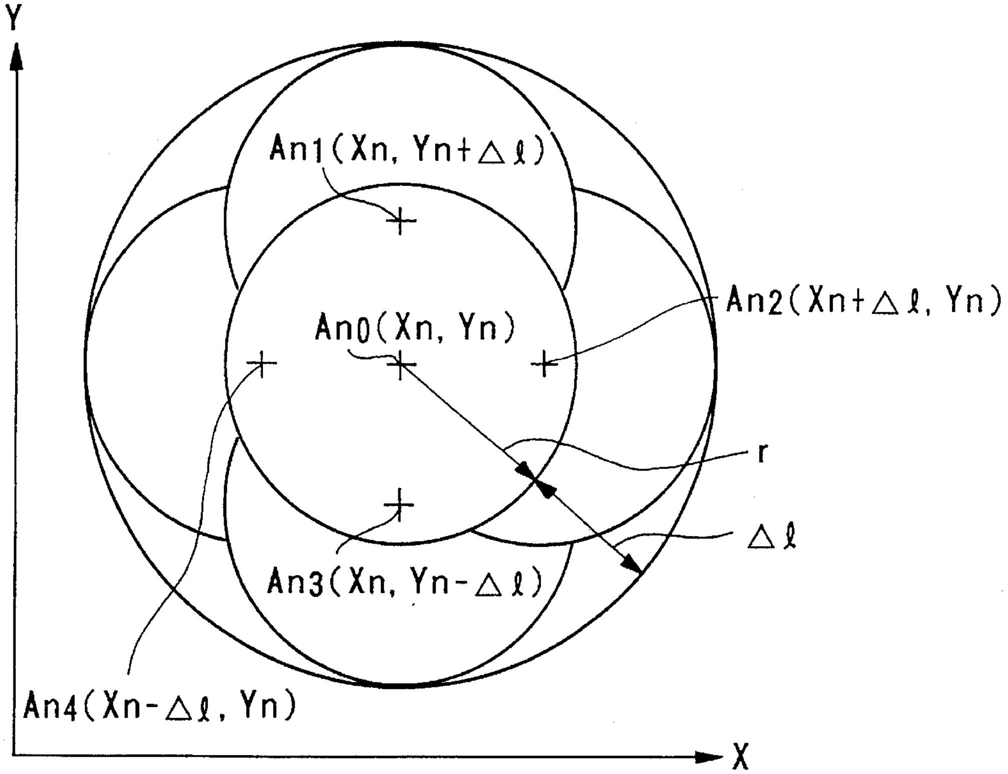
FIG. 4 is a diagram showing an example of the relationship between the press-fitting coordinates and the correction coordinates.
Figure 5:
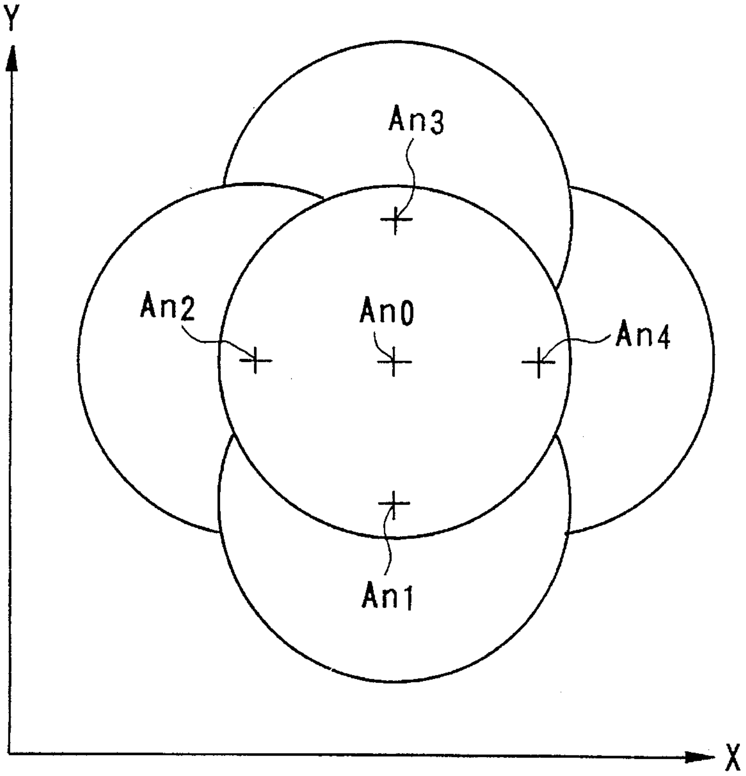
FIG. 5 is a diagram showing an example of the relationship between the press-fitting coordinates and the correction coordinates.

As described above, correction coordinates Ani represent the coordinates of positions which are separated from press-fitting coordinates An0 by ±Δ1 in the X direction and Y direction; in this embodiment, the correction coordinates An1, An2, An3, and An4 are determined in the order indicated in FIG. 4.

In this embodiment, the movement frequency of the correction coordinates Ani of the connector 22 was set to "4"; however, Δ1 is quite small in comparison to radius r, so that the form which can be achieved by moving the through hole 34*a* having the radius r four times, resulting in correction coordinates An1, An2, An3, and An4 approximates a circle having a radius (r+δ1). Accordingly, as shown in FIGS. 13B and 13C, in the case in which all the pins 22*a* of connector 22 are inclined in the same direction, if the connector is inserted at the position of correction coordinates Ani shown in FIGS. 4 and 5, then this is inserted in a through hole having a radius (r+Δ1), and the probability of insertion is increased.

Next, after the insertion of pins 22*a* of connector 22 at correction coordinates Ani has been confirmed, in the state in which pins 22*a* are inserted into printed board 34, the NC-movement table 38 is moved to press-fitting coordinates An0, and connector 22 is press-fitted.

Figure 13A:
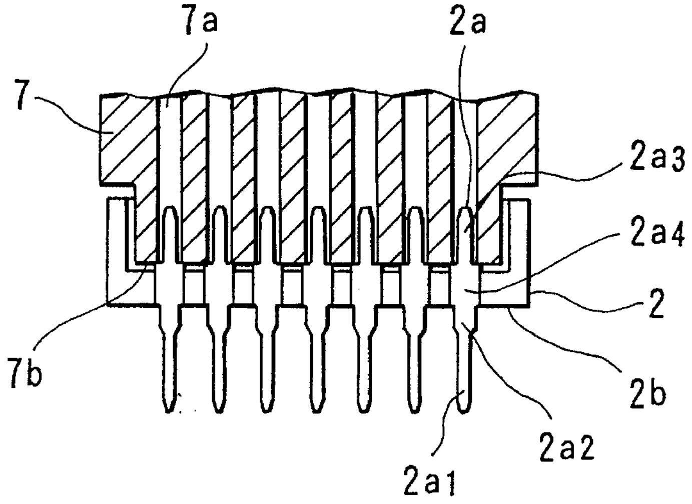
FIG. 13A (PRIOR ART)
FIG. 13A is a diagram for the purpose of explaining the state in which pins 2*a* are inserted in a normal manner into connector 2 by means of press-fitting head 7.
Figure 13B:
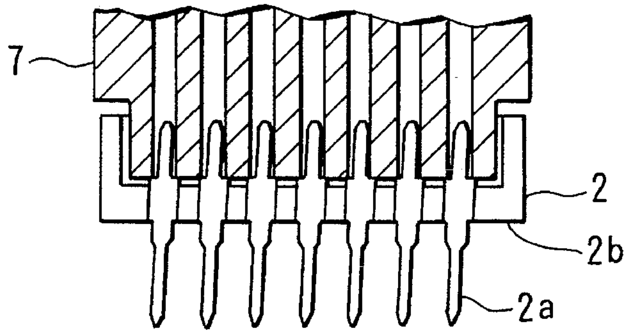
FIG. 13B (PRIOR ART)
FIG. 13B is a diagram for the purpose of explaining an example of the relationships between the inclination of pins 2*a* of connector 2 and press-fitting head 7.
Figure 13C:
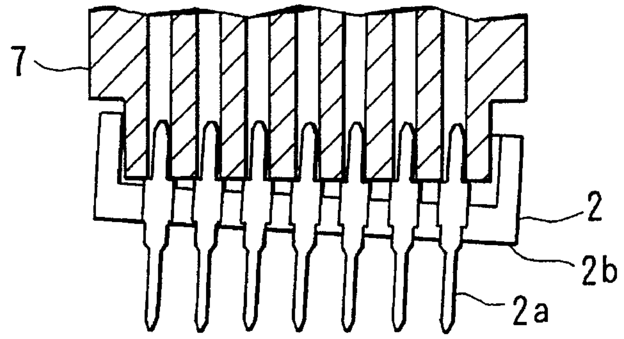
FIG. 13C (PRIOR ART)
FIG. 13C is a diagram for the purpose of explaining an example of the relationship between the inclination of the pins 2*a* of the connector 2 and the press-fitting head 7.

Furthermore, in a connector 2 such as that shown in FIGS. 13B and 13C, an identical trend appears in each manufacturing lot. In the present embodiment, in the case in which the correction coordinate position of the NC-movement table 38 is the same correction coordinates Ani for a continuous number of cycles K, for example, in the case in which the correction position is indicated by the correction coordinates An3 shown in FIGS. 4 and 5 for a continuous number of cycles K, the order of correction is modified, and the connector 22 is inserted at the correction coordinates Ani, which have continued for a number of cycles K. In this way, the probability of insertion is increased.

Next, the operation of the connector press-fitting apparatus shown in FIG. 3 will be explained with reference to the flow charts shown in FIGS. 6A and 6B. An operator inputs press-fitting coordinates An0 in advance into press-fitting coordinate memory 50*c* using input part 50*a*, and the total press-fitting number S of connector 22, a correction frequency L1 of the insertion of connector 22, an insertion defect member L2 of connector 22, and a correction continuation frequency K of the same correction coordinates are inputted in advance into setting memory 50*d* using input part 50*b*.

Figure 6A:
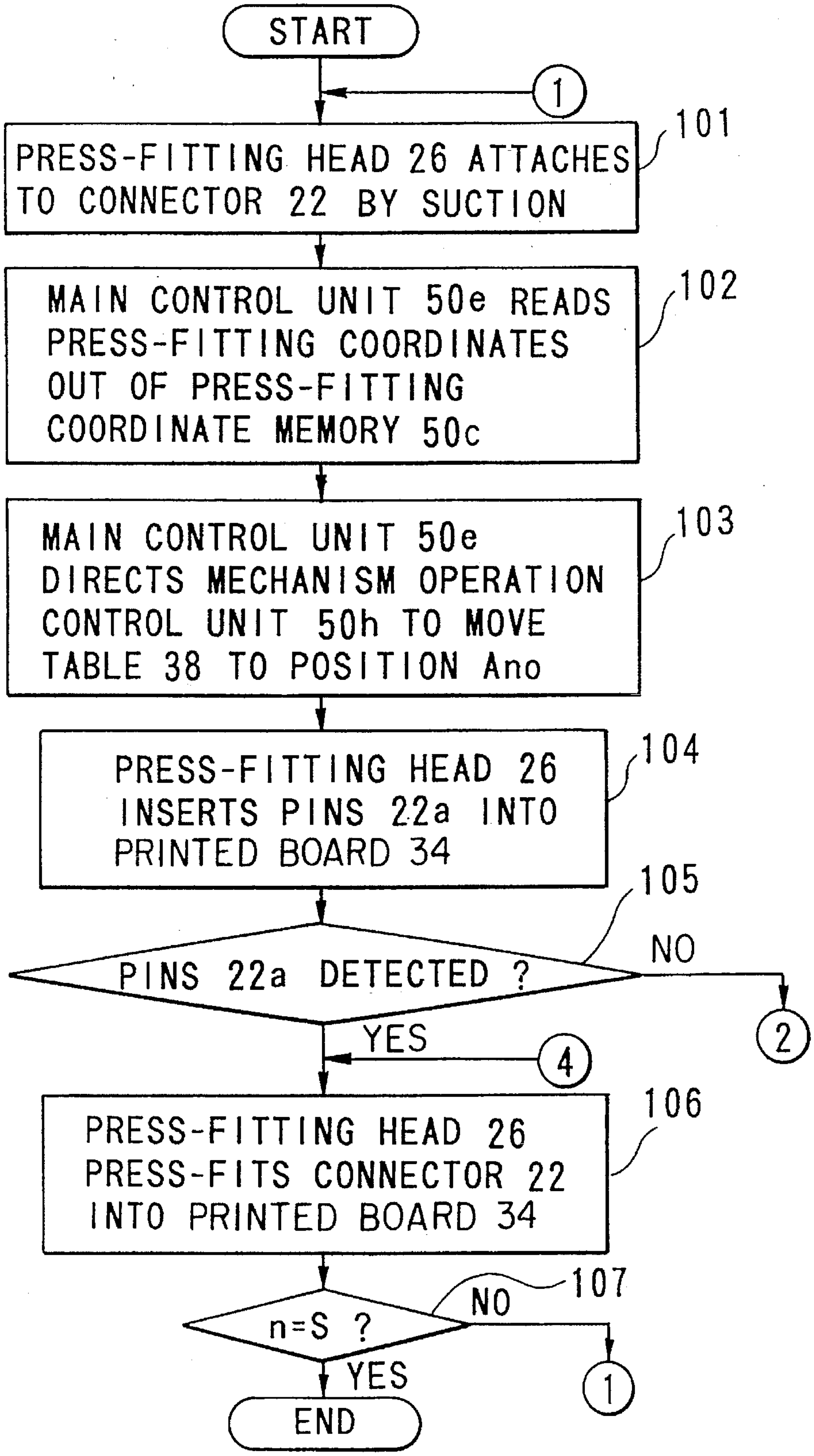
FIG. 6A is a flow chart expressing the operation of the connector press-fitting apparatus shown in FIG. 3.

First, in step 101 in FIG. 6A, press-fitting head 26 attaches to connector 22 by means of suction; in step 102, main control unit 50*e* reads out press-fitting coordinates from press-fitting coordinate memory 50*c*; in step 103, main control unit 50*e* directs mechanism operation control unit 50*h* so as to move NC-movement table 38 to press-fitting coordinates An0; and in step 104, press-fitting head 26 inserts pins 22*a* into printed board 34.

In step 105, a determination is made as to whether pin detector 36 has detected pins 22*a*. Then, in the case in which pin detector 36 has detected pins 22*a*, control proceeds to step 106. In step 106, press-fitting head 26 press-fits connector 22 into printed board 34, and control proceeds to step 107. In step 107, in the case in which the connector press-fitting position number n has reached the total press-fitting number S of connector 22, operations are halted, and the subsequent connector 22 is press-fitted into printed board 34. On the other hand, in step 107, in the case in which the connector press-fitting position number n has not reached the total press-fitting number S of connector 22, control reverts to step 101, and the subsequent connector 22 is press-fitted into printed board 34.

Figure 6B:
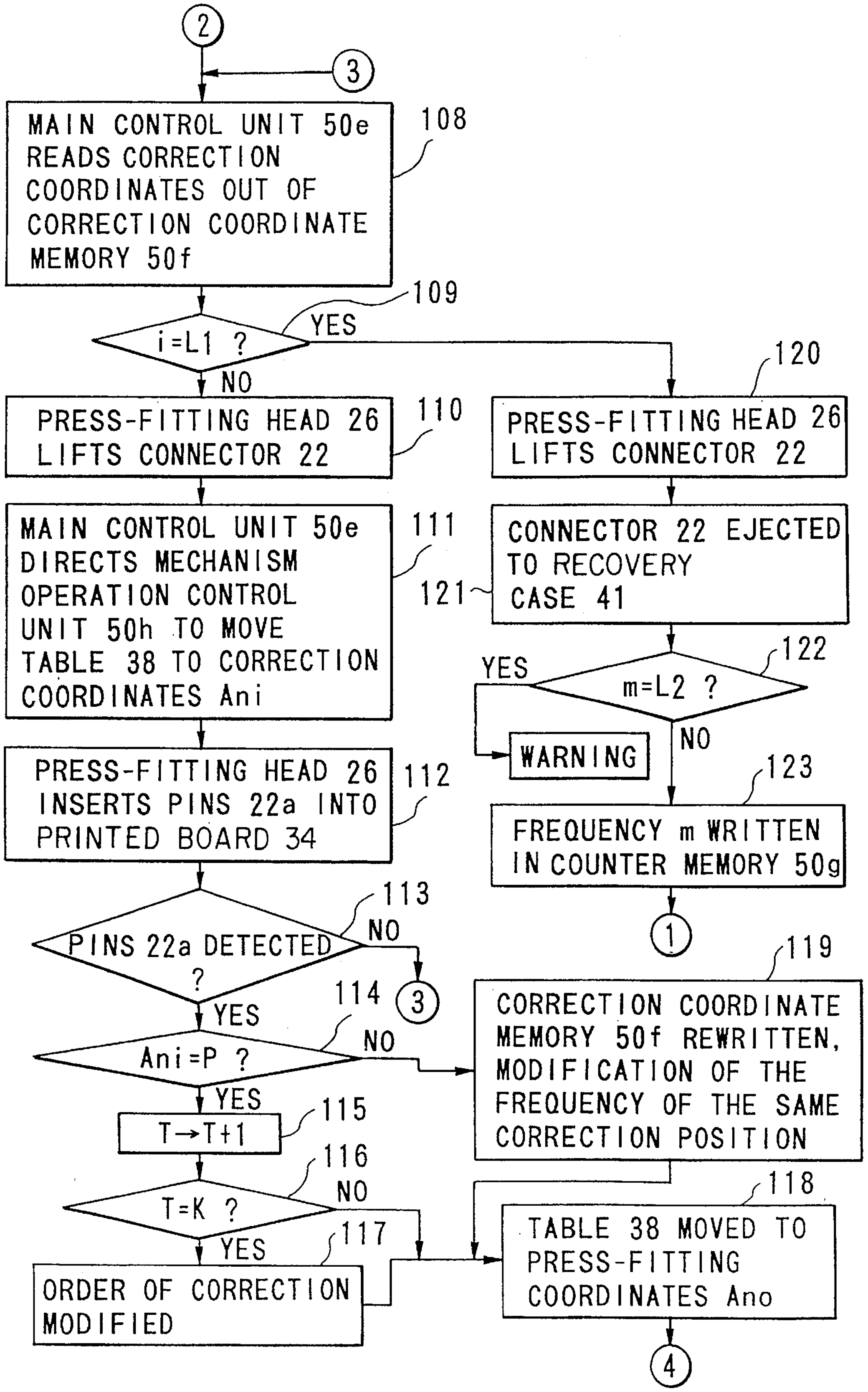
FIG. 6B is a flow chart expressing the operation of the connector press-fitting apparatus shown in FIG. 3.

Furthermore, in step 105, in the case in which pin detector 36 has not detected pins 22*a*, control proceeds to step 108 in FIG. 6B. In step 108, main control unit 50*e* reads out correction coordinates Ani from correction coordinate memory 50*f*, and control proceeds to step 109. In step 109, a determination is made as to whether the variable i of correction coordinates Ani has reached the correction frequency L1 of the same connector. In step 109, in the case in which the frequency i of correction coordinates Ani has not reached the correction frequency L1 of the same connector, control proceeds to step 110, and in the case in which this variable has reached correction frequency L1, control proceeds to step 120. In step 110, press-fitting head 26 lifts connector 22 in a state of suction attachment, and in step 111, main control unit 50*e* directs mechanism operation control unit 50*h* so that NC-movement table 38 is moved to correction coordinates Ani. In step 112, press-fitting head 26 descends, and the pins 22*a* of connector 22 are inserted into printed board 34, and control proceeds to step 113.

In step 113, a determination is made as to whether pin detector 36 has detected a pin 22*a*. In step 113, in the case in which pin detector 36 has not detected a pin 22*a*, control reverts to step 108, and the connector 22 is inserted at the subsequent correction coordinates Ani. On the other hand, in step 113, in the case in which pin detector 36 has detected a pin 22*a*, control proceeds to step 114. In step 114, a determination is made as to whether correction coordinates Ani are in agreement with the previous correction coordinates P. In step 114, in the case in which correction coordinates Ani are in agreement with the previous correction coordinates P, control proceeds to step 115, and in step 115, a value of 1 is added to the continuous insertion frequency T of the same correction coordinates Ani, and control proceeds to step 116. In step 116, a determination is made as to whether the continuous insertion frequency T of the same correction coordinates Ani is in agreement with the correction continuation frequency K of the same correction coordinates Ani which is established in setting memory 50*d*. In step 116, in the case in which continuous insertion frequency T is in agreement with correction continuation frequency K, control proceeds to step 117, and in step 117, the correction coordinates Ani stored in correction coordinate memory 50*f* are rewritten, the order of correction from the press-fitting coordinates to the correction coordinates is modified, and control proceeds to step 118. In step 118, NC-movement table 38 is moved to press-fitting coordinates An0, and control reverts to step 106 of FIG. 6*a*.

Furthermore, in step 114, in the case in which correction coordinates Ani are not in agreement with the previous correction coordinates P, control proceeds to step 119, and in step 119, the correction coordinates Ani of the correction coordinate memory 50*f* are rewritten, the continuous insertion frequency T of the same correction coordinates Ani is calculated, and control proceeds to step 118. Furthermore, in step 116, in the case in which continuous insertion frequency T is not in agreement with correction continuation frequency K, the step 117 is skipped over, and control proceeds to step 118.

Furthermore, in step 109, in the case in which the variable i of correction coordinates Ani reaches the correction frequency L1 of the same connector, control proceeds to step 120. In step 120, press-fitting head 26 lifts the connector 22 in a suction attached state, and in step 121, the connector 22 is ejected to defective product case 41 (see FIG. 1), and control proceeds to step 122. In step 122, the insertion defect number m of the connector 22 which is stored in counter memory 50*g* is compared with the insertion defect number L2 which was stored in advance in setting memory 50*d*. In step 122, in the case in which insertion defect number m is equal to insertion defect number L2, then main control unit 50*e* supplies a warning directive to warning unit 51. By means of this, warning unit 51 dispatches a warning to the operator by means of a tone, light, or the like. On the other hand, in step 122, in the case in which insertion defect number m is not equal to insertion defect number L2, then a value of 1 is added to the insertion defect number m which is stored in counter memory 50*g*, control reverts to step 101, and the subsequent connector 22 is press-fitted.

3. THIRD EMBODIMENT

Figure 7:
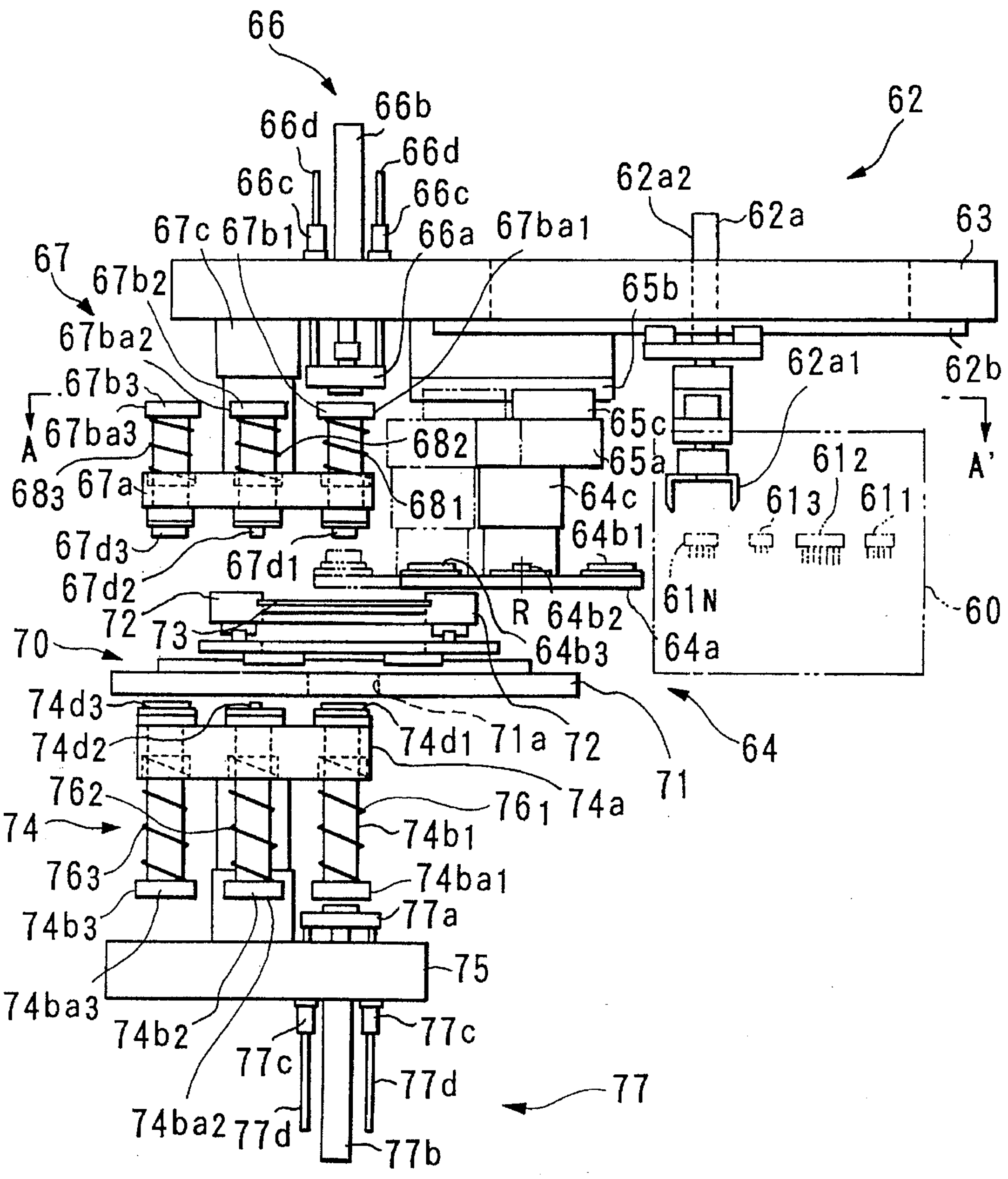
FIG. 7 is a front view showing the construction of a connector press-fitting apparatus in accordance with a third embodiment of the present invention.

Next, a third embodiment of the present invention will be explained. FIG. 7 is a front view showing a construction of a connector press-fitting apparatus in accordance with the third embodiment of the present invention. In the Figure, stocker 60 stores and maintains a plurality of types of connectors 611–61N by type in differing magazine cases. Conveyor unit 62 comprises conveying mechanism 62*b*, which is provided along an upper base member 63 having an elongated shape, and a gripping mechanism 62*a*, which is conveyed by means of this conveying mechanism 62*b*. Gripping mechanism 62*a* comprises a chuck unit 62*a*1 which conducts the chucking of connectors 61 from stocker 60, and a drive unit 62*a*2, which drives this chuck unit 62*a*1 freely in a vertical direction. Conveyor unit 62 conducts the chucking of pre-specified connectors 61 from stocker 60 in accordance with directives supplied from a control unit which is not depicted in the Figure, and conveys these to the side of insertion turret 64. Chuck unit 62a1 is provided with a mechanism for gripping connectors 61, and possesses a rotation mechanism which fits the gripped connectors 61 into insertion turret 64 with a pre-specified orientation.

Insertion turret 64 comprises a disk-shaped rotating table 64a, insertion blocks 64b1–64bN, which are arranged on this rotating table 64a and a drive motor 64c which drives rotating table 64a so as to rotate about a rotational axis R. The insertion blocks 64bl–64bN, which are arranged along the periphery of rotating table 64a, have pin insertion holes formed therein which are in agreement with the shape of the various connectors 611–61N and the pin arrangements thereof. Accordingly, based on directives from a control unit which is not depicted in the Figure, insertion turret 64 controls rotating table 64a so that an insertion block 64b corresponding to the type of connector 61 which is conveyed by conveyor unit 62 is placed at the insertion position. This insertion turret 64 is supported elastically above attachment plate 65a, and is conveyed to the side of the press-fitting turret 67 through the medium of slide rails 65b which connect attachment plate 65a and base plate 65c. Attachment plate 65a, slide rails 65b, and base plate 65c comprise the transport mechanism 65.

Press-fitting unit 66 is attached to upper base member 63, and comprises press-fitting block 66a, cylinder 66b, guides 66c, and guide shafts 66d. A hollow flow path is formed in press-fitting block 66a. One end of cylinder 66b is affixed to press-fitting block 66a, and cylinder 66b is capable of moving press-fitting block 66a freely in a vertical direction. One end of guide shafts 66d is affixed to press-fitting block 66a, and guide shafts 66d slide in a vertical direction together with press-fitting block 66a, guided by guides 66c which are attached to upper base member 63. These guide shafts 66d regulate the horizontal oscillation during the vertical movement of press-fitting block 66a.

Press-fitting turret 67 is disposed at the lower part of one end of the upper base member 63, and comprises a rotating table 67a, push rods 67b1–67bN, drive motor 67c, and press-fitting heads 67d1–67dN. Rotating table 67a is disk-shaped, and is driven so as to rotate by drive motor 67c. A number of penetrating holes corresponding to the insertion blocks 64b1–64bN described above are provided in a peripheral direction in rotating table 67a, and push rods 67b1–67bN are engaged in these penetrating holes in a freely slidable manner. The interior of push rods 67b1–67bN is formed so as to be hollow. Suspension parts 67ba1–67baN are formed at the upper end side of each push rod 67b1–67bN, and compressive coil springs 681–68N are attached between the suspension parts 67ba1–67baN and the rotating table 67a. Accordingly, in each push rod 67b, an urging force is normally applied from the surface of the rotating table 67a in the direction of the suspension part 67ba by means of the compressive coil springs 68. Furthermore, press-fitting heads 67d1–67dN, which correspond to the shape and pin arrangement of each connector 611–61N, are attached to the lower end of each push rod 67b. These press-fitting heads 67d are installed at the lower surfaces of each push rod 67b so as to bring the longitudinal direction of the connector 61 into conformity with the radial direction of the rotating table 67a. The press-fitting turret 67 having such a construction controls the rotation of rotating table 67a based on directives from a control unit which is not depicted in the Figure. That is to say, the rotating table 67a is controlled so that a press-fitting head 67d which is in agreement with the type of connector 61 (the shape or pin arrangement thereof) which is transported to the press-fitting position in a state of insertion into an insertion block 64b, is set at the press-fitting position.

Figure 8:
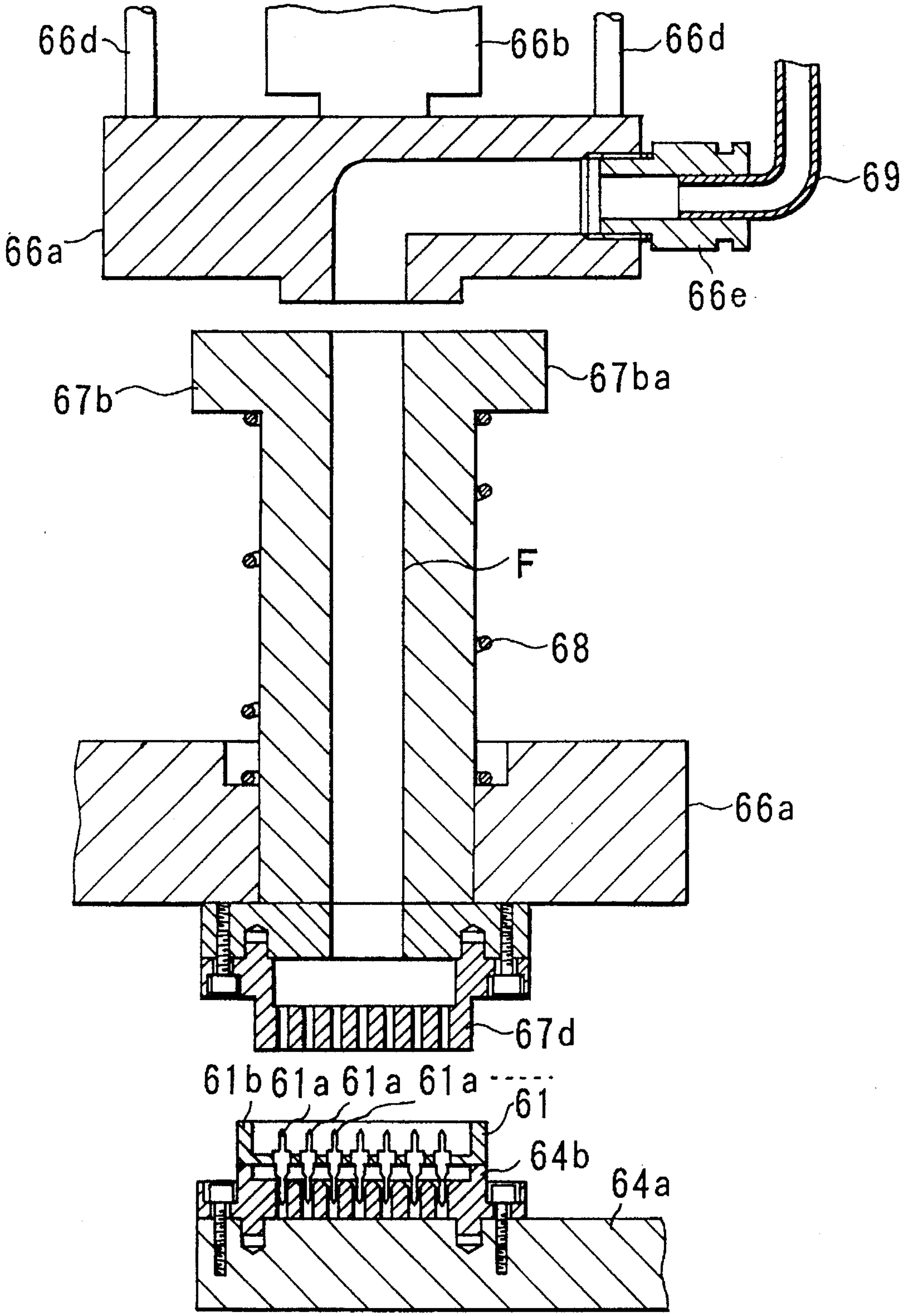
FIG. 8 is a diagram for the purpose of explaining the positional relationships of the insertion block 64*b*, the press-fitting block 66*a*, the push rod 67*b*, and the press-fitting head 67*d* shown in FIG. 7.

Here, with reference to FIG. 8, the positional relationships of the press-fitting block 66a, push rods 67b, press-fitting heads 67d, and insertion block 64b will be explained. First, as shown in FIG. 8, the insertion block 64b and the press-fitting head 67d are in mutual opposition, separated by a pre-specified gap, when placed in the press-fitting position. On the other hand, the upper end surface of the push rod 67b is in opposition to the lower surface of the press-fitting block 66a. Accordingly, when the cylinder 66b of press-fitting unit 66 descends and presses the press-fitting block 66a downward, the lower surface of the press-fitting block 66a and the upper end surface of the push rod 67b come into contact, and a flow path F is formed. One end side of flow path F passes through push rod 67b, and forms an open end which penetrates press-fitting head 67d, while the other end side thereof is connected to a tube 69 through the medium of a joint 66e which is attached to the side surface of press-fitting block 66a. The interior of the flow path F is placed under reduced pressure or increased pressure by means of a vacuum pump or a compressor pump (not depicted in the Figure) which is connected to the end of tube 69, and by means of this, the press-fitting head 67d is attached to or detached from connector 61. As shown in FIG. 8, the connector 61 which is inserted into insertion block 64b comprises a plurality of pins 61a and a housing 61b which supports the base end parts of each pin 61a. The lead end parts of each pin 61a are inserted into pin insertion holes in insertion block 64b. On the other hand, the upper end parts of each pin 61a are inserted into punch holes formed in press-fitting head 67d.

Next, an explanation of the outline of the construction of this embodiment will be continued with reference to FIG. 7. A NC-movement table 70 comprising X and Y stages and the like is disposed above bed 71 and below the press-fitting position described above; furthermore, a printed board 73 is affixed and supported on this NC-movement table 70 through the medium of a support platform 72. NC-movement table 70 moves the connector installation position of printed board 73 to the press-fitting position which is described above, and drives the X and Y stages in accordance with a directive signal supplied from a control unit which is not depicted in the Figure, and thus conducts positioning. Penetrating hole 71a, into which push rod 74b and pressure receiving heads 74d of the pressure receiving turret 74, which is discussed hereinbelow, are inserted from beneath, is provided in bed 71. A pressure-receiving turret 74 which is attached to lower base member 75 is arranged below bed 71.

Pressure receiving turret 74 comprises a rotating table 74a, push rods 74b1–74bN, drive motor 74c, and pressure receiving heads 74d1–74dN. The rotating table 74a is disk-shaped, and is driven so as to rotate by means of drive motor 74c. A number of penetrating holes corresponding to the press-fitting heads 67d1–67dN described above are formed in rotating table 74a along the circumferential direction thereof. Push rods 74b1–74bN are engaged in each penetrating hole so as to be freely slidable, and suspension parts 74ba1–74baN are formed at the lower ends of each push rod 74b1–74bN. Compression coil springs 761–76N are attached between these suspension parts 74b1–74baN and the rotating table 74a, and an urging force is applied from the surface of rotating table 74a in the direction of suspension parts 74ba1–74baN by means of the compression coil springs 761–76N. Furthermore, pressure receiving heads 76*d*1–76*d*N, which are in agreement with the shapes and pin arrangements of each connector 611–61N, respectively, are attached to the upper end of each push rod 74*b*. Pressure receiving turret 74 controls the rotation of rotating table 74*a* based on directives from a control unit which is not depicted in the Figure, and sets a pressure-receiving head 74*d*, which is in agreement with the shape and pin arrangement of the connector 61 which is placed at the press-fitting position, so as to be in opposition to the press-fitting position.

Pressure-receiving unit 77 is attached to the lower part of the lower base member 75, and comprises a pressure-receiving block 77*a*, a cylinder 77*b*, guides 77*c*, and guide shafts 77*d*. One end of cylinder 77*b* is affixed to pressure-receiving block 77*a*, and is capable of moving pressure-receiving block 77*a* freely in a vertical direction. One end of guide shafts 77*d* is affixed to pressure-receiving block 77*a*, and these slide in a vertical direction together with pressure-receiving block 77*a*, guided by guides 77*c* which are attached to lower base member 75. These guide shafts 77*d* restrict the lateral oscillation during the vertical motion of the pressure-receiving block 77*a*.

Figure 9:
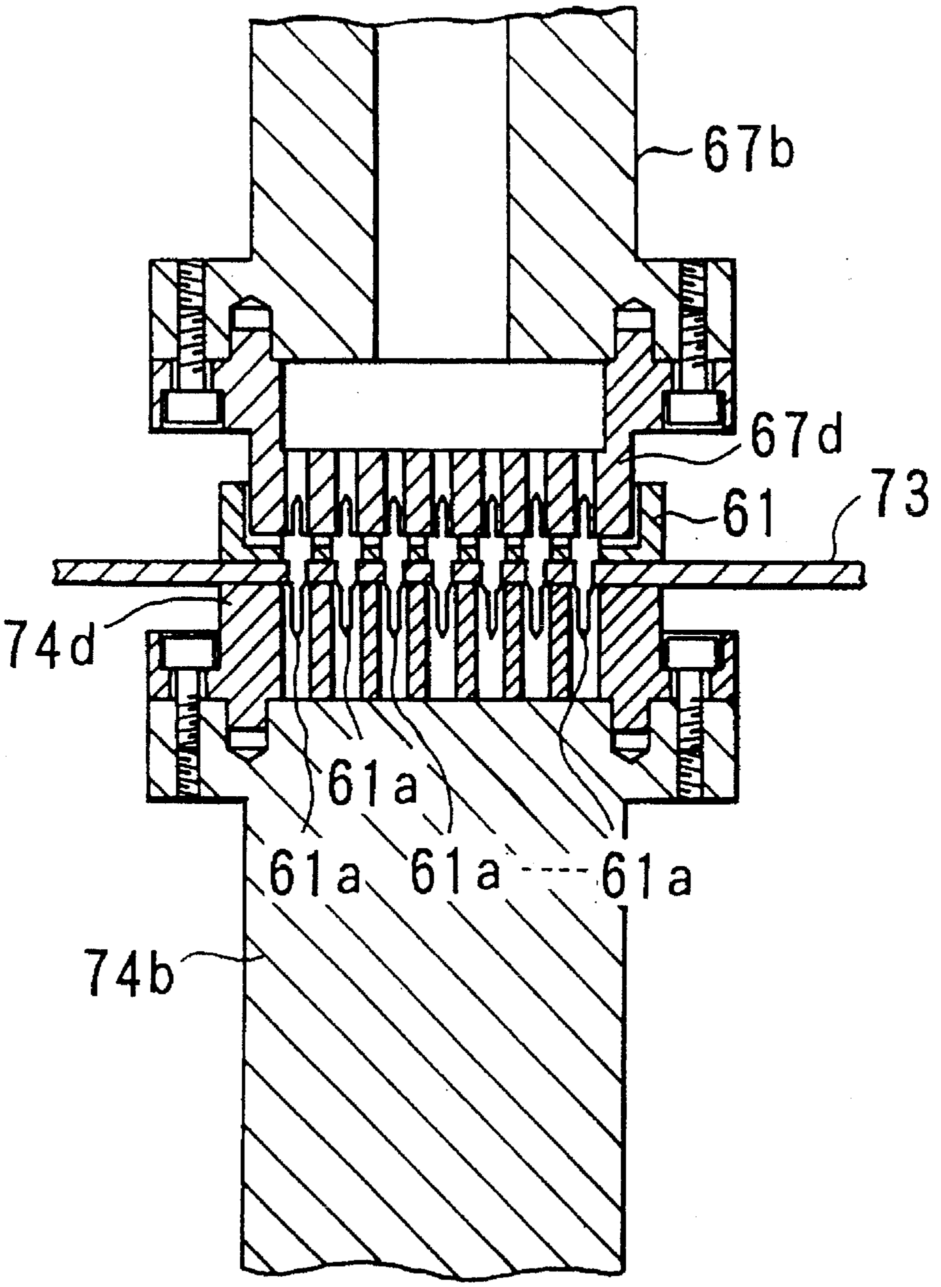
FIG. 9 is a diagram for the purpose of explaining the positional relationships of the push rod 67*b*, the press-fitting head 67*d*, and the pressure-receiving head 74*d*.

Here, the positional relationships of the push rods 74*b*, the pressure-receiving heads 74*d*, and the press-fitting heads 67*d* will be explained with reference to FIG. 9. First, the connector 61 which is attached by suction to the press-fitting head 67*d* is pressed downward by cylinder 66*b*, and by means of this, the lower ends of pins 61*a* are press-fitted into the through holes and the like of printed board 73. At this time, pressure-receiving unit 77 is synchronized with the press-fitting operation of press-fitting head 67*d* and projects cylinder 77*b* upwards, and push rod 74*b* is lifted. The pressure-receiving head 74*d* which is attached to the upper ends of push rod 74*b* comes into contact with the lower surface side of printed board 73 through the medium of the penetrating hole 71*a* which is formed in bed 71. As a result, as shown in FIG. 9, the pressure-receiving head 74*d* and the press-fitting head 67*d* come into contact with one another in a state of interposition in the connector 61 which is press-fitted into printed board 73. In this state, the upper end parts of pins 61*a* are inserted into the punch holes of press-fitting head 67*d*, and the lower end parts of pins 61*a* project below the printed board 73 and are inserted into the punch holes of pressure-receiving head 74*d*.

Next, the press-fitting operation of the connector press-fitting apparatus having the composition described above will be explained with reference to FIG. 10. Here, four types of connectors 611–614 are stored in stocker 60, and insertion blocks 64*b*1–64*b*4, press-fitting heads 67*d*1–67*d*4, and pressure-receiving heads 74*d*1–74*d*4, which agree with these connectors 611–614, are installed in advance in all corresponding portions.

Now, it will be assumed that, for example, among the connectors 611–614 which are stored in stocker 60, a directive directing the press-fitting of connector 614 into printed board 73 is sent to all portions of the apparatus from a control unit which is not depicted in the Figure. When this occurs, in this connector press-fitting apparatus, the insertion turret 64 sets the insertion block 64*b* which is in agreement with the shape and the pin arrangement of the connector 614 at the insertion position. Furthermore, in press-fitting turret 67 and pressure-receiving turret 74, the various rotating tables 67*a* and 74*a* are controlled so that press-fitting head 67*d*4, and pressure-receiving head 74*d*4, which correspond to the connector 614, are set at the press-fitting positions.

Figure 10:
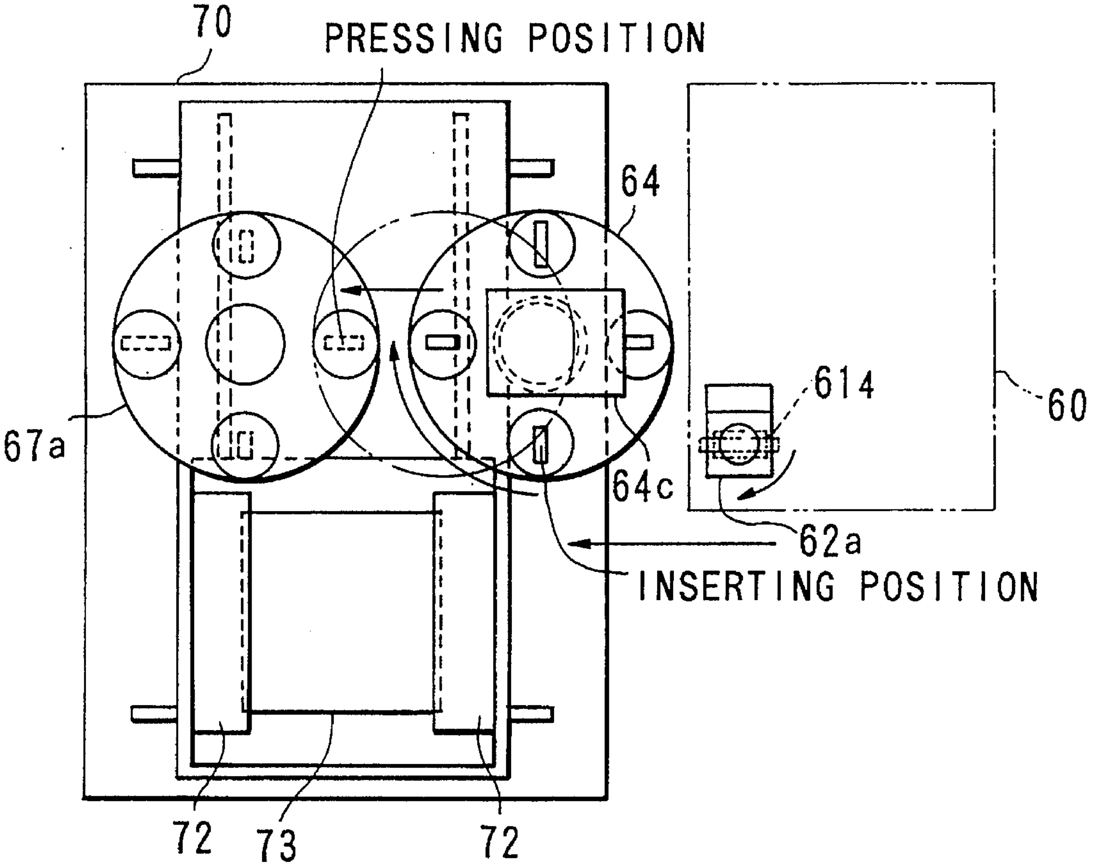
FIG. 10 is a top view for the purpose of explaining the operation of the connector press-fitting apparatus shown in FIG. 7.
Figure 11:
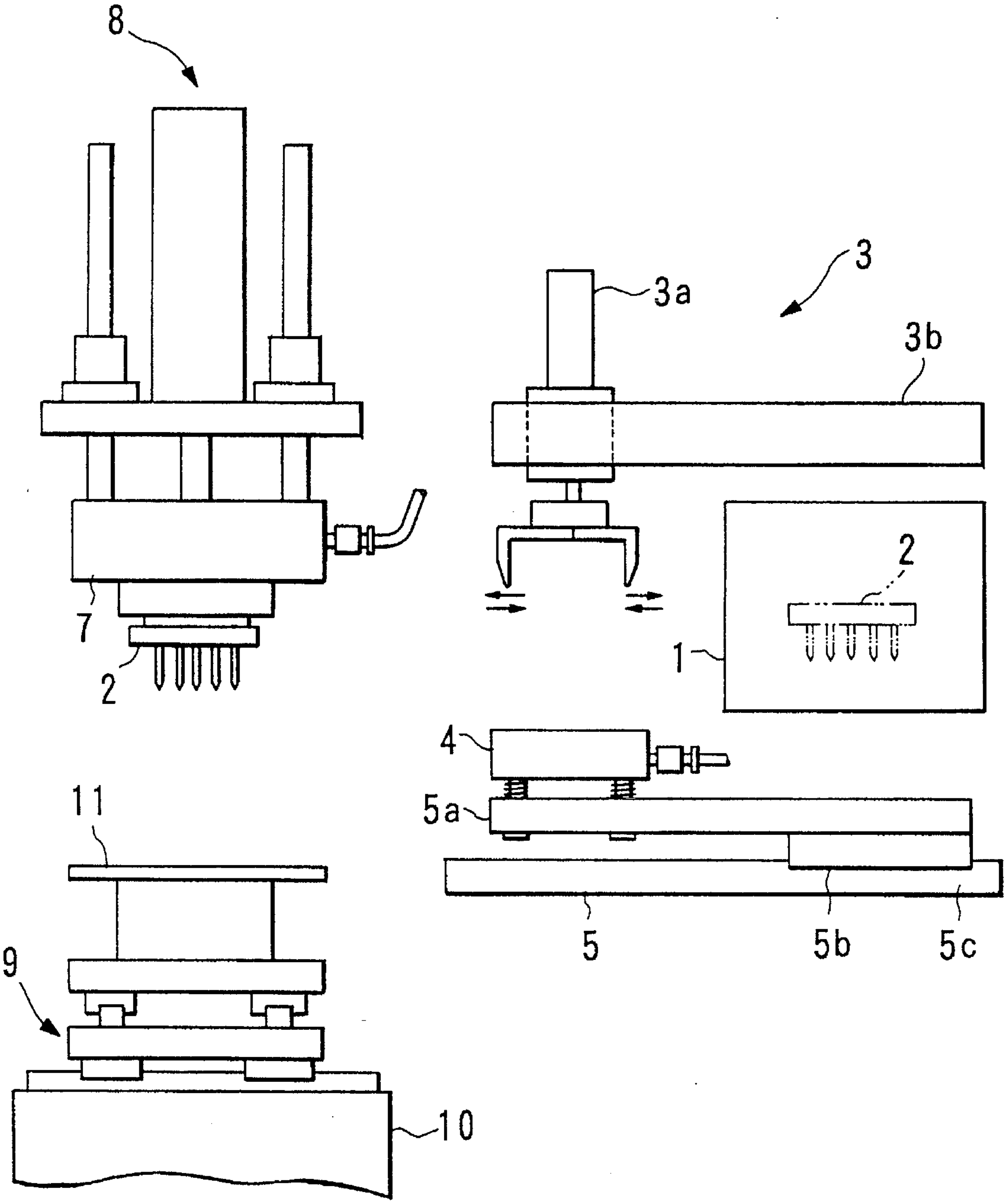
FIG. 11 (PRIOR ART)
FIG. 11 is a front view showing a structural example of a conventional connector press-fitting apparatus.
Figure 12:
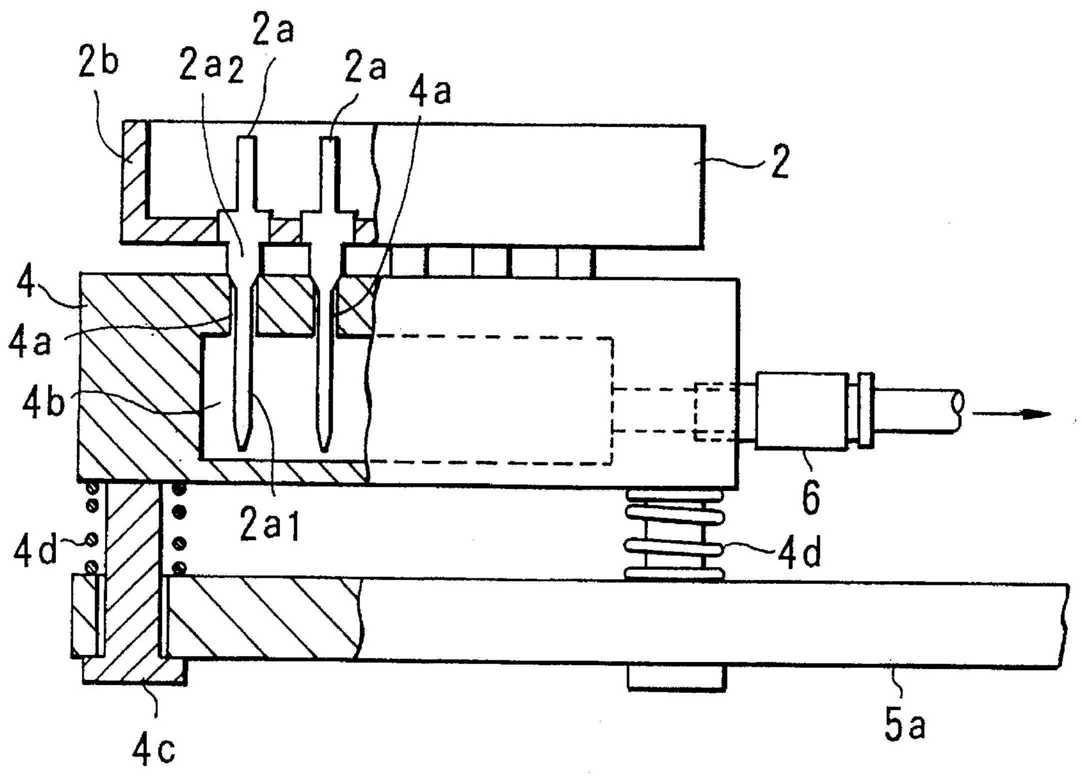
FIG. 12 (PRIOR ART)
FIG. 12 is a partial cross sectional view showing the more detailed construction of the connector 2, insertion unit 4, and attachment plate 5*a* shown in FIG. 11.

In this state, when the chuck unit 62*a*1 of the gripping mechanism 62*a* conducts the chucking of connector 614, as shown in FIG. 10, the chuck unit 62*a*1 rotates by 90° in a clockwise direction. Then, while maintaining this state, the conveyor mechanism 62*b* conveys the connector 614 to the insertion position. When the conveyor mechanism 62*b* reaches the insertion position, the gripping mechanism 62*a* is lowered, and the connector 614 is installed in the insertion block 64*b*4 which was prepared by insertion turret 64. The insertion block 64*b*4 having connector 614 inserted therein has the longitudinal direction of the connector 614 thereof brought into conformity with the direction of transport by means of a 90° rotation in a clockwise direction of the rotating table 64*a*. After this, insertion turret 64 is moved in a leftward direction in the Figure by means of transport mechanism 65, and by means of this, the insertion block 64*b*4 is set at the press-fitting position. When the connector 614 is placed at the press-fitting position, press-fitting unit 66 presses cylinder 66*b* downwards, and press-fitting block 66*a* and push rod 67*b*4 come into contact. By means of this, the flow path F which is described above is formed, and the pressure of this flow path F is reduced by means of a vacuum pump (not depicted in the Figure). Next, cylinder 66*b* pushes the push rod 67*b*4 downward at a pressure which exceeds the urging force applied to the push rod 67*b*4. Then, when the press-fitting head 67*d*4 which is attached to the lower part of the push rod 67*b*4 and the connector 614 come into contact, the upper ends of the pins 614*a* of the connector 614 are taken into the punch holes formed in press-fitting head 67*d*4. When connector 614 is attached by suction to press-fitting head 67*d*4, the cylinder 66*b* weakens the downward pushing force. By means of this, the push rod 67*b*4 is urged in an upward direction by means of the compression coil spring 684, and returns to the original position thereof while maintaining the flow path F.

Next, NC-movement table 70 positions the connector installation position of the printed board 73 to the press-fitting position, in accordance with instructions from a control unit which is not depicted in the Figure. When the printed board is set to the press-fitting position, press-fitting unit 66 again pushes push rod 67*b*4 downward, and synchronously with this, pressure-receiving unit 77 pushes push rod 74*b*4 upward. The pressure at which the pressure receiving unit 77 pushes the push rod 74*b*4 upward is greater than the downward pushing force of the press-fitting unit 66. Then, when the lower end parts of the pins 614*a* of the connector 614 which is attached by suction to the press-fitting head 67*d*4 are press-fitted into the through holes and the like of printed board 73 by press-fitting unit 66, the pressure-receiving unit 77 supports the press-fitting by means of the pressure-receiving head 74*d*4, from the side of the lower surface of the printed board 73. As a result, as shown in FIG. 9, the pressure-receiving head 74*d*4 and the press-fitting head 67*d*4 are placed in mutual contact in an interposed state in the connector 61 which is press-fitted into printed board 73. In this state, the upper end parts of the pins 614*a* are inserted into the punch holes of press-fitting head 67*d*4, and the lower end parts of the pins 614*a* project below printed board 73 and are inserted into the punch holes of pressure receiving head 74*d*4, so that the bending or the like of the pins 614*a* is corrected, and the connector press-flitting is conducted in an appropriate pin arrangement state. When the connector press-fitting operation is completed in this manner, compressed air is blown from flow path F, and press-fitting head 67*d*4 and connector 614 are detached.

When the connector press-fitting operation is completed, the cylinders 66*b* and 77*b* of the press-fitting unit 66 and the pressure-receiving unit 77 return to the lowered end or raised end thereof, and in accordance with this, push rods

67b4 and 74b4 return to the original positions thereof as a result of the urging force of compression coil springs 684 and 764. At this point in time, the NC-movement table 70 conducts the subsequent connector press-fitting operation, so that the installation position of the printed board 73 is positioned to the press-fitting position. Furthermore, insertion turret 64 sets an insertion block 64b, which is in agreement with the shape and pin arrangement of the connector 61 which is to be subsequently press-fitted, at the insertion position. Furthermore, in press-fitting turret 67 and pressure-receiving turret 74, rotating tables 67a and 74a are controlled, and a press-fitting head 67d and pressure-receiving head 74d which correspond to the connector 61 which is to be subsequently press-fitted are set at the press-fitting positions.

In this way, in accordance with the third embodiment described above, insertion blocks 64b, press-fitting heads 67d, and pressure-receiving heads 74d corresponding to the type of connectors 61 which are stored in the stocker 60 are provided in advance, and in accordance with the type of connector 61 to be press-fitted, the insertion turret 64, press-fitting turret 67, and pressure-receiving turret 74 automatically select insertion blocks 64b, press-fitting heads 67d, and pressure-receiving heads 74d which are in agreement with the shape of the connector 61 and the arrangement of the pins 61a prior to the press-fitting operation, so that it is possible to install a plurality of types of connectors 61 in printed boards automatically and with high efficiency.

In the third embodiment described above, an example was used in which there were 4 types of connectors 61; however, this is not necessarily so limited, and it is of course the case that this embodiment is applicable to more than 4 types of connectors 61. In the case in which the number of types of connectors 61 is increased, it is preferable to increase the diameter of the rotating tables 64a, 67a, and 74a which comprise the insertion turret 64, press-fitting turret 67, and pressure-receiving turret 74.

What is claimed is:

1. An apparatus for press-fitting press-fit connectors into printed boards, comprising:

press-fitting head for making contact with a press-fit connector, and for attaching to and detaching from said connector;

support means for elastically supporting said press-fitting head;

press-fitting means for freely moving said support means in the vertical direction, and for moving said support means downward and for press-fitting pins of said connector into a printed board disposed at a press-fitting position;

first detecting means for detecting displacement of said press-fitting head, and for detecting an amount of distance said press-fitting means descends in an insertion operation to insert pin lead end parts of said connector into said printed board;

second detecting means for detecting at least one said pin lead end part projecting below said printed board in accordance with said insertion operation; and control means for press-fitting the pins of said connector by performing the two, steps of:

determining whether a least one said pin lead end part projects below the printed board in response to the detection of said second detecting means, and causing said press-fitting means to press-fit pin base end parts of said connector into said printed board, when it is determined that the at least one said pin lead end part projects below the printed board.

2. An apparatus for press-fitting connectors into printed boards comprising:

a moving table for supporting a printed board into which a connector is to be press-fitted, the moving table being capable of independent movement in a vertical direction and a horizontal direction in a plane;

a press-fitting head for making contact with said connector and for attaching to and detaching from said connector;

press-fitting means for moving said press-fitting head in a vertical direction, and for moving said press-fitting head downward to press-fit said pins of said connector into said printed board;

detecting means for detecting at least one pin lead end part of said connector projecting below said printed board when said connector is press-fitted into said printed board;

first memory means for storing press-fitting coordinates of a location where said connector is to be press-fitted into said printed board;

second memory means for storing correction coordinates separated by a pre-specified distance from said press-fitting coordinates; and control means for reading said press-fitting coordinates and said correction coordinates from said first and second memory means, for moving said moving table based on said press-fitting coordinates and said correction coordinates, and for moving said press-fitting means upwards and downwards;

after said control means reads out said press-fitting coordinates from said first memory means and moves said moving table based on said press-fitting coordinates, when said press-fitting head is moved downwards by said press-fitting means and said connector is press-fitted into said printed board, if said detecting means does not detect at least one said pin lead end part, then after said press-fitting head is moved upwards by means of said press-fitting means, said control means reads out the correction coordinates stored in said second memory means, moves said moving table based on said correction coordinates, moves said press-fitting head downwards using said press-fitting means to press-fit said connector into said printed board, and at this time, said control means repeats, for a pre-specified number of times, processing wherein a determination is made as to whether or not said detecting means has detected at least one said pin lead end part, and when said detecting means does not detect at least one said pin lead end part, even after repeating said processing for said pre-specified number of times, said control means detaches said connector from said press-fitting head as a connector having a press-fitting deficiency, and when at least one said pin lead end part was detected by said detecting means in said processing, said control means first moves said moving table based on said press-fitting coordinates, moves said press-fitting means further downward and press-fits pin base end parts of said connector into said printed board, and then writes the correction coordinates into said second memory means.

3. An apparatus for press-fitting connectors into printed boards in accordance with claim 2, wherein said control means counts a number of the connectors press-fitting deficiencies, and when the number this count exceeds a pre-specified value, generates a warning.

4. An apparatus for press-fitting connectors into printed boards in accordance with claim 2, wherein said correction coordinates comprise coordinates which are separated from said press-fitting coordinates in the vertical or horizontal direction by a distance smaller than a diameter of holes of said printed board.

5. An apparatus for press-fitting connectors into printed boards in accordance with claim 2, wherein, when said connector is press-fitted into said printed board based on identical correction coordinates for a pre-specified continuous number of times, said control means modifies an order of control from said press-fitting coordinates to said correction coordinates, and writes said correction coordinates in said second memory means.

6. An apparatus for press-fitting connectors into printed boards, comprising:

storage means for storing a plurality of connectors, having a plurality of types, for press-fitting into a printed board;

control means for generating at least a first directive designating at least one type of said connector, and a second directive indicating a mounting position on the printed board at which a connector designated by said first directive is to be press-fitted;

insertion block arrangement means, provided with a plurality of insertion blocks comprising members into which lead end parts of pins of said connectors are to be inserted and in which pin insertion holes corresponding to said plurality of types of connectors are formed, for selecting insertion blocks corresponding to said first directive and arranging said selected insertion blocks at insertion positions;

conveying means for removing connectors corresponding to said first directive from said storage means, conveying said connectors to said insertion positions, and inserting said connectors into said insertion blocks;

transport means for transporting said insertion blocks into which said connectors have been inserted to press-fitting positions;

suction attachment means, provided with a plurality of press-fitting heads in which pin insertion holes corresponding to said plurality of types of connectors are respectively formed, and into which upper end parts of pins of corresponding connectors are inserted, for selecting a press-fitting head corresponding to said first directive from among said press-fitting heads, arranging said selected press-fitting head at said press-fitting position, bringing said selected press-fitting head into contact with the connector inserted into said insertion block, and attaching said connector to said press-fitting head by means of suction;

positioning means, established below said suction attachment means, for maintaining said printed board so as to be in opposition to said press-fitting heads, and for positioning said installation position on this printed board to said press-fitting position in accordance with said second directive; and pressure-receiving means, established below said positioning means and provided with a plurality of pressure-receiving heads in which pin insertion holes corresponding to said plurality of types of connectors are respectively formed, and into which lower end parts of pins of corresponding connectors are inserted, for selecting a pressure-receiving head corresponding to said first directive from among said pressure-receiving heads, and for arranging said selected pressure-receiving head at said press-fitting position;

said suction attachment means lowers said press-fitting head while maintaining suction attachment of said connector as said pressure receiving means raises said pressure-receiving head, and when said printed board is interposed between said press-fitting head and said pressure-receiving head, said connector is maintained in a sandwiched manner as said connector is press-fitted at an installation position on said printed board.

* * * * *